(12) United States Patent
Bok et al.

(10) Patent No.: US 12,307,034 B2
(45) Date of Patent: May 20, 2025

(54) DISPLAY DEVICE

(71) Applicant: Samsung Display Co., Ltd., Yongin-Si (KR)

(72) Inventors: Seung-Lyong Bok, Hwaseong-si (KR); Kicheol Kim, Yongin-si (KR); Byeong-Hee Won, Incheon (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 18/218,675

(22) Filed: Jul. 6, 2023

(65) Prior Publication Data
US 2023/0354672 A1    Nov. 2, 2023

Related U.S. Application Data

(62) Division of application No. 17/385,368, filed on Jul. 26, 2021, now Pat. No. 11,730,040.

(30) Foreign Application Priority Data

Oct. 22, 2020 (KR) ........................ 10-2020-0137692

(51) Int. Cl.
*G06F 3/044* (2006.01)
*G06F 3/041* (2006.01)
(Continued)

(52) U.S. Cl.
CPC ......... *H10K 59/131* (2023.02); *G06F 3/0412* (2013.01); *G06F 3/0416* (2013.01);
(Continued)

(58) Field of Classification Search
CPC .... G06F 3/0412; G06F 3/0416; G06F 3/0443; G06F 2203/04102; G06F 2203/04112;
(Continued)

(56) References Cited

U.S. PATENT DOCUMENTS 9,501,147 B2   11/2016 Heubel et al.
10,839,744 B2  11/2020 Li et al.
(Continued)

FOREIGN PATENT DOCUMENTS

EP   2940554 A1 * 11/2015 ............. A63F 13/24
EP   3608964 A1 *  2/2020 ............. G09F 9/301
(Continued)

OTHER PUBLICATIONS

Hocheng and Chen, "Design, Fabrication, and Failure Analysis of Stretchable Electrical Routings", Sensors 14, 11855-11877 (2014). (Year: 2014).*

*Primary Examiner* — Julie Anne Watko
(74) *Attorney, Agent, or Firm* — F. CHAU & ASSOCIATES, LLC

(57) ABSTRACT

A display device includes a stretchable substrate that includes a plurality of unit regions. Each of the plurality of unit regions includes a plurality of island regions and at least one bridge region that connects adjacent island regions to each other. A display panel is on the stretchable substrate. The display panel includes a plurality of display parts and at least one wiring part. The plurality of display parts correspondingly overlap the plurality of island regions. The at least one wiring part correspondingly overlaps the at least one bridge region. An input sensor is on the display panel. The input sensor includes a plurality of sensing electrodes and at least one subsidiary electrode. The plurality of sensing electrodes correspondingly overlaps the plurality of unit regions. When viewed in a plan view the at least one subsidiary electrode is correspondingly disposed between adjacent sensing electrodes.

13 Claims, 24 Drawing Sheets

(51) Int. Cl.
*H10K 59/131* (2023.01)
*H10K 77/10* (2023.01)
*G09G 3/3233* (2016.01)
*H10K 59/35* (2023.01)
*H10K 59/40* (2023.01)
*H10K 102/00* (2023.01)

(52) U.S. Cl.
CPC .......... *G06F 3/0443* (2019.05); *H10K 77/111* (2023.02); *G06F 2203/04102* (2013.01); *G06F 2203/04112* (2013.01); *G09G 3/3233* (2013.01); *H10K 59/352* (2023.02); *H10K 59/40* (2023.02); *H10K 2102/311* (2023.02)

(58) Field of Classification Search
CPC .. H10K 59/122; H10K 59/123; H10K 59/131; H10K 59/352; H10K 59/40; H10K 77/111; H10K 2102/311; Y02E 10/549; G09G 3/3233
See application file for complete search history.

(56) References Cited

U.S. PATENT DOCUMENTS

| | | | |
|---|---|---|---|
| 11,393,887 B2* | 7/2022 | Wang | H10K 77/111 |
| 2013/0083496 A1* | 4/2013 | Franklin | G09G 3/2092 |
| | | | 361/752 |
| 2016/0049602 A1* | 2/2016 | Kim | H10K 59/12 |
| | | | 257/40 |
| 2016/0320878 A1 | 11/2016 | Hong et al. | |
| 2017/0068318 A1* | 3/2017 | McClure | G06F 3/016 |
| 2018/0174523 A1* | 6/2018 | Jeon | H10K 59/131 |
| 2018/0188851 A1 | 7/2018 | Choi | |
| 2019/0280077 A1 | 9/2019 | Park et al. | |
| 2019/0296097 A1 | 9/2019 | Hong et al. | |
| 2020/0037442 A1 | 1/2020 | Keum et al. | |
| 2020/0143771 A1 | 5/2020 | Choong | |
| 2020/0212117 A1* | 7/2020 | Jeon | H01L 27/1218 |
| 2020/0312248 A1 | 10/2020 | Shin et al. | |
| 2022/0130911 A1 | 4/2022 | Bok et al. | |
| 2022/0206619 A1* | 6/2022 | Kim | G06F 3/0412 |

FOREIGN PATENT DOCUMENTS

| | | |
|---|---|---|
| KR | 10-1634642 | 6/2016 |
| KR | 10-1871652 | 6/2018 |
| KR | 10-2018-0079055 | 7/2018 |
| KR | 10-2019-0107238 | 9/2019 |
| KR | 10-2019-0112880 | 10/2019 |
| KR | 10-2020-0012419 | 2/2020 |
| KR | 10-2020-0017336 | 2/2020 |
| KR | 10-2020-0029042 | 3/2020 |

* cited by examiner

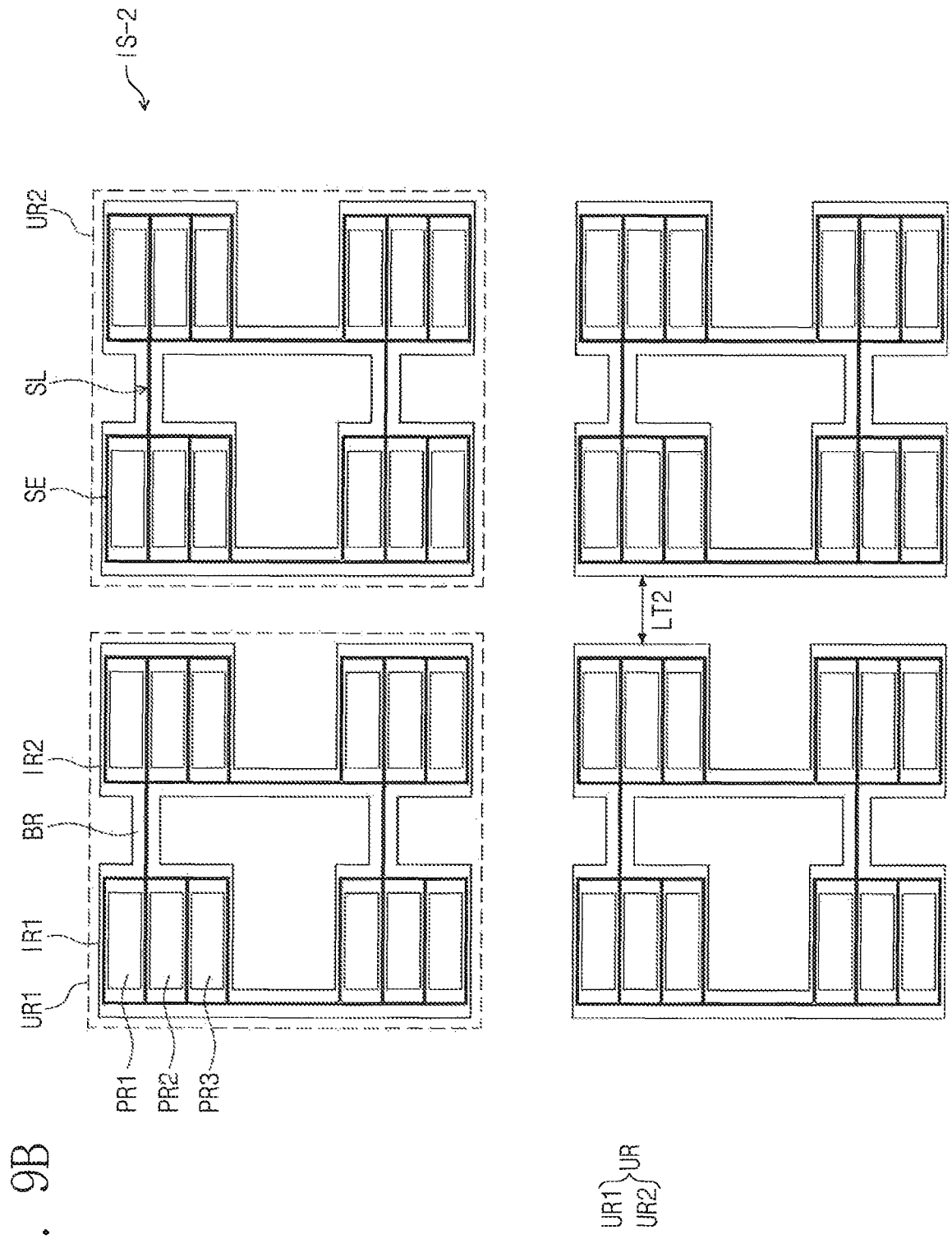

DISPLAY DEVICE

CROSS-REFERENCE TO RELATED APPLICATIONS

This application is a divisional application based on U.S. patent application Ser. No. 17/385,368 filed on Jul. 26, 2021, which claims priority under 35 U.S.C § 119 to Korean Patent Application No. 10-2020-0137692, filed on Oct. 22, 2020 in the Korean Intellectual Property Office, the disclosures of which are incorporated by reference in their entireties herein.

1. TECHNICAL FIELD

The present inventive concepts relate to a display device, and more particularly, to a display device that is stretchable in response to an externally applied force.

2. DISCUSSION OF RELATED ART

Display devices display various images on a display screen for providing information to the user. Display devices generally display information within an allocated screen.

Flexible display devices have been developed which include flexible display modules. Unlike flat display devices, flexible display devices may be foldable, rollable, and/or bendable. A flexible display device that is variously modifiable in shape may be carried by the user without limitation due to the size of the screen and the flexible display device may be placed on curved objects for increased convenience of the user.

Display devices that are stretchable in a specific direction may have an emission element and wiring lines disposed on a base substrate. However, the wiring lines may be damaged when the base substrate is stretched which may result in malfunction of the display device.

SUMMARY

According to an embodiment of the present inventive concepts, a display device includes an input sensor that is free of fail even when the input sensor is stretched by an externally applied force.

According to an embodiment of the present inventive concepts, a display device includes a stretchable substrate that includes a plurality of unit regions. Each of the plurality of unit regions includes a plurality of island regions and at least one bridge region that connects adjacent island regions of the plurality of island regions to each other. A display panel is on the stretchable substrate. The display panel includes a plurality of display parts and at least one wiring part. The plurality of display parts correspondingly overlap the plurality of island regions. The at least one wiring part correspondingly overlaps the at least one bridge region. An input sensor is on the display panel. The input sensor includes a plurality of sensing electrodes and at least one subsidiary electrode. The plurality of sensing electrodes correspondingly overlaps the plurality of unit regions. When viewed in a plan view the at least one subsidiary electrode is correspondingly disposed between adjacent sensing electrodes of the plurality of sensing electrodes.

In an embodiment, the plurality of island regions may include a first island region and a second island region that are correspondingly defined on the plurality of unit regions and are adjacent to each other.

In an embodiment, the stretchable substrate may include a first unit region and a second unit region adjacent to the first unit region. The plurality of wiring parts may be disposed between the first unit region and the second unit region.

In an embodiment, the plurality of subsidiary electrodes may correspondingly overlap the plurality of wiring parts.

In an embodiment, the plurality of display parts may correspondingly include a plurality of pixels.

In an embodiment, the display panel may further include a thin encapsulation layer that covers the plurality of display parts. The input sensor may be directly disposed on the thin encapsulation layer.

In an embodiment, the plurality of sensing electrodes and the plurality of subsidiary electrodes may have a mesh shape.

In an embodiment, the input sensor may further include a first sensing line and a second sensing line. The first sensing line may be connected to a corresponding one of the plurality of sensing electrodes. The second sensing line may be connected to a corresponding one of the plurality of subsidiary electrodes.

In an embodiment, the plurality of sensing electrodes may include a first sensing electrode and a second sensing electrode that are adjacent to each other. Each of the plurality of subsidiary electrodes may be disposed between the first sensing electrode and the second sensing electrode.

In an embodiment, the stretchable substrate may have a first mode and a second mode stretched from the first mode. The plurality of unit regions may be spaced apart from each other at a first distance in the first mode and are spaced apart from each other at a second distance in the second mode. The second distance may be greater than the first distance.

In an embodiment, the first sensing electrode and the second sensing electrode may be spaced apart from each other at the first distance in the first mode and are spaced apart from each other at the second distance in the second mode.

In an embodiment, in the first mode, the subsidiary electrode may be deactivated to have a first area. In the second mode, the subsidiary electrode may be activated to have a second area and to detect an external input.

In an embodiment, the first area may be proportional to the first distance. The second area may be proportional to the second distance.

In an embodiment, the display device may further comprise an input detection circuit. When an external input is detected through the plurality of sensing electrodes, the input detection circuit may calculate a plurality of coordinate data that correspond to the plurality of the plurality of sensing electrodes.

In an embodiment, the first sensing electrode may have a first coordinate data. The second sensing electrode may have a second coordinate data. When the external input is detected through the first sensing electrode and the second sensing electrode, the input detection circuit may calculate the first coordinate data and the second coordinate data that respectively correspond to the first sensing electrode and the second sensing electrode.

In an embodiment, the subsidiary electrode between the first and second sensing electrodes may have a third coordinate data.

In an embodiment, in the first mode, the input detection circuit may calculate the first coordinate data and the second coordinate data. In the second mode, the input detection circuit may calculate the third coordinate data together with the first coordinate data and the second coordinate data.

In an embodiment, in the second mode, the subsidiary electrode between the first and second sensing electrodes may be activated to have a third coordinate data. When the second mode is detected, based on the third coordinate data, the input detection circuit may remap the first coordinate data and the second coordinate data, and may calculate the third coordinate data, the remapped first coordinate data, and the remapped second coordinate data.

In an embodiment, the stretchable substrate may further include a strain gauge that determines the first mode or the second mode.

In an embodiment, the input detection circuit may determine activation of the subsidiary electrode by receiving information about the first mode or the second mode from the strain gauge.

According to an embodiment of the present inventive concepts, a display device includes a stretchable substrate that includes a plurality of unit regions. Each of the plurality of unit regions includes a plurality of island regions and at least one bridge region that connects adjacent island regions of the plurality of island regions to each other. A display panel is on the stretchable substrate. The display panel includes a plurality of pixels that correspondingly overlaps the plurality of island regions. An input sensor is on the display panel. The input sensor includes a plurality of sensing electrodes and at least one subsidiary electrode. The plurality of sensing electrodes correspondingly overlaps the plurality of unit regions. When viewed in a plan view the at least one subsidiary electrode is correspondingly disposed between adjacent sensing electrodes of the plurality of sensing electrodes. An input detection circuit calculates a plurality of coordinate data that correspond to the plurality of sensing electrodes. The input detection circuit calculates a plurality of coordinate data of the plurality of sensing electrodes in a first mode in which the plurality of island regions are spaced apart from each other at a first distance, and the plurality of coordinate data of the plurality of sensing electrodes and a plurality of coordinate data of the at least one subsidiary electrode in a second mode in which the plurality of island regions are spaced apart from each other at a second distance.

According to an embodiment of the present inventive concepts, a display device includes a stretchable substrate having a first mode in an unstretched state and a second mode in a stretched state. The stretchable substrate includes a plurality of unit regions. Each of the plurality of unit regions includes a plurality of island regions and at least one bridge region that connects adjacent island regions of the plurality of island regions to each other. A display panel is on the stretchable substrate. The display panel includes a plurality of pixels that correspondingly overlaps the plurality of island regions. An input sensor is on the display panel. The input sensor includes a plurality of sensing electrodes and at least one subsidiary electrode. The plurality of sensing electrodes correspondingly overlaps the plurality of unit regions. When viewed in a plan view the at least one subsidiary electrode is correspondingly disposed between adjacent sensing electrodes of the plurality of sensing electrode. An input detection circuit calculates a plurality of coordinate data that corresponds to the plurality of sensing electrodes. The input detection circuit remaps at least one of the plurality of coordinate data based on coordinate data of the at least one subsidiary electrode when the stretchable substrate is in the second mode.

BRIEF DESCRIPTION OF THE DRAWINGS

FIGS. 9A and 9B illustrate plan views showing an input sensor according to embodiments of the present inventive concepts.

DETAILED DESCRIPTION OF EMBODIMENTS

Figure 1:
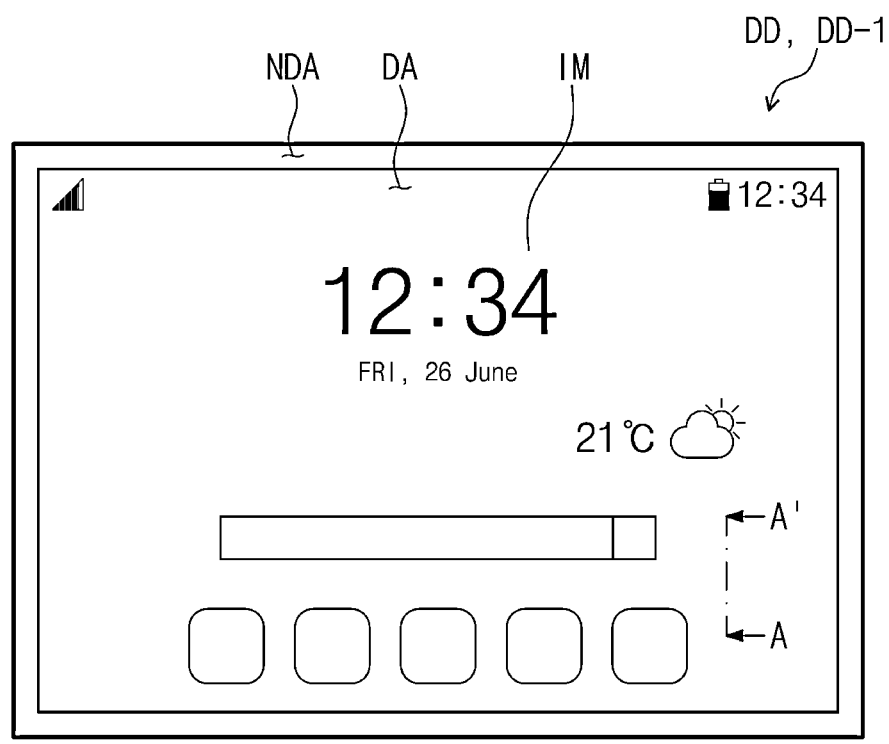
FIGS. 1 and 2 illustrate plan views showing a display device according to embodiments of the present inventive concepts.
Figure 1:
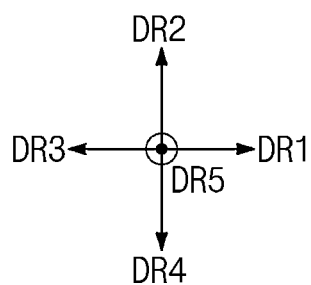

In this description, when a certain component (or region, layer, portion, etc.) is referred to as being "on", "connected to", or "coupled to" other component(s), the certain component may be directly disposed on, directly connected to, or directly coupled to the other component(s) or at least one intervening component may be present therebetween. When a certain component (or region, layer, portion, etc.) is referred to as being "directly on", "directly connected to", or "directly coupled to" other components, no intervening components may be present therebetween.

Like numerals indicate like components. Moreover, in the drawings, thicknesses, ratios, and dimensions of components are exaggerated for effectively explaining the technical contents. The term "and/or" includes one or more combinations defined by associated components.

It will be understood that, although the terms first, second, etc. may be used herein to describe various components, these components should not be limited by these terms. These terms are only used to distinguish one component from another component. For example, a first component could be termed a second component, and vice versa without departing from the scope of the present inventive concepts. Unless the context clearly indicates otherwise, the singular forms are intended to include the plural forms as well.

In addition, the terms "beneath", "lower", "above", "upper", and the like are used herein to describe the relationship of one component to other component(s) illustrated in the drawings. The relative terms are intended to encompass different orientations in addition to the orientation depicted in the drawings.

It should be understood that the terms "comprise", "include", "have", and the like are used to specify the presence of stated features, integers, steps, operations, components, elements, or combinations thereof, but do not preclude the presence or addition of one or more other features, integers, steps, operations, components, elements, or combinations thereof.

Unless otherwise defined, all terms used herein including technical and scientific terms have the same meaning generally understood by one of ordinary skilled in the art. Also, terms as defined in dictionaries generally used should be understood as having meaning identical or meaning contextually defined in the relevant art and should not be understood as ideally or excessively formal meaning unless definitely defined herein.

The following will now describe some embodiments of the present inventive concepts in conjunction with the accompanying drawings.

Figure 2:
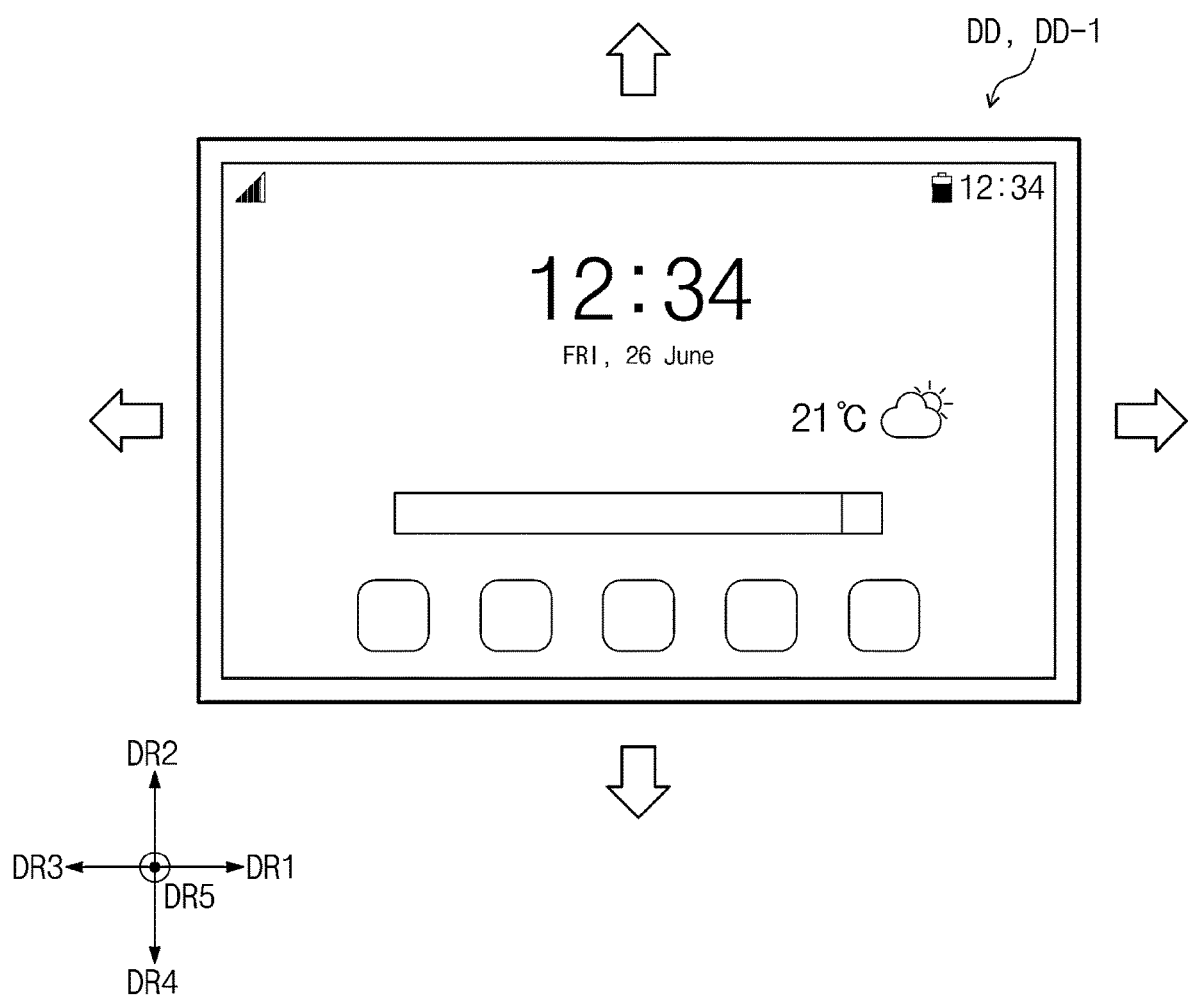
Figure 3:
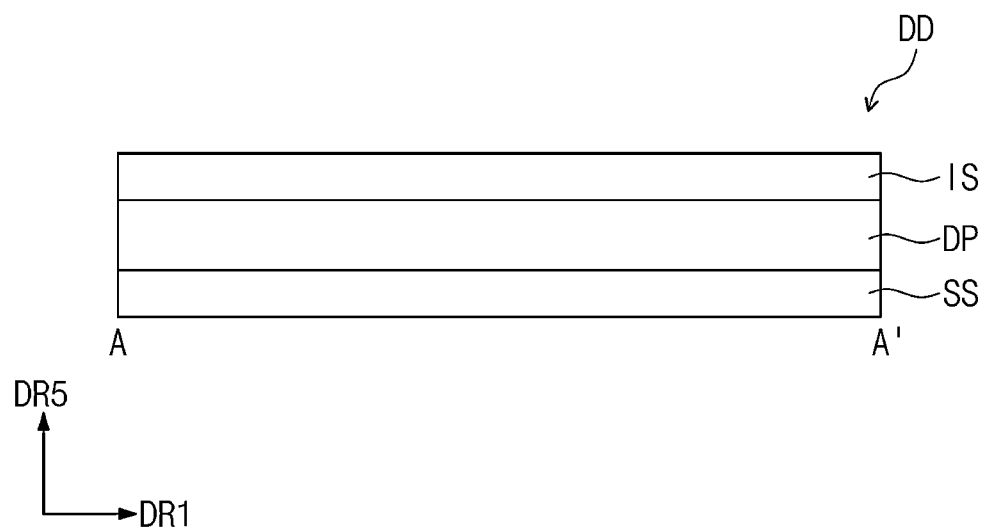
FIGS. 3 and 4 illustrate cross-sectional views showing a display device taken along line A-A' of FIG. 1 according to embodiments of the present inventive concepts.
Figure 4:
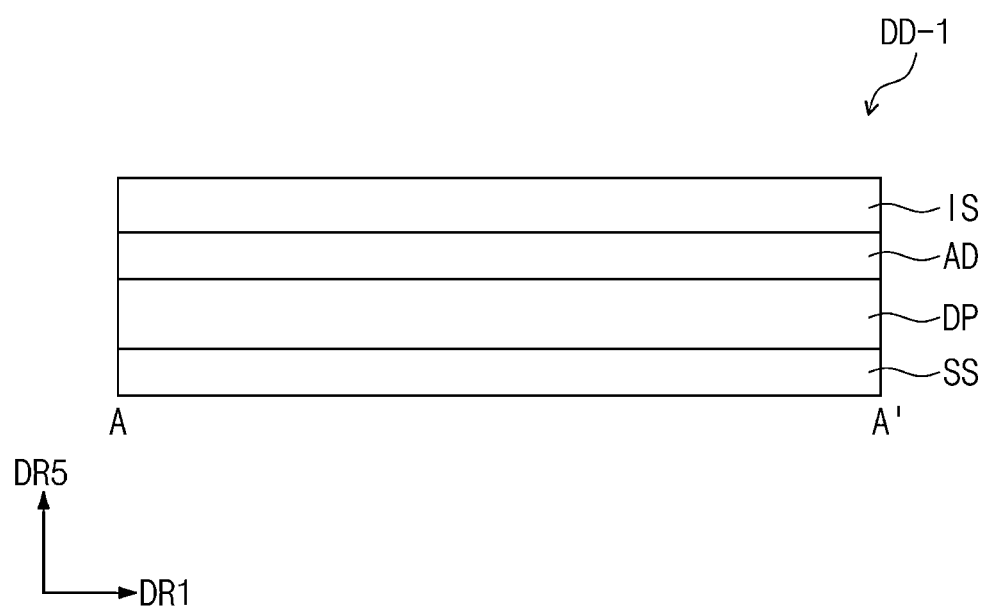
Figure 5:
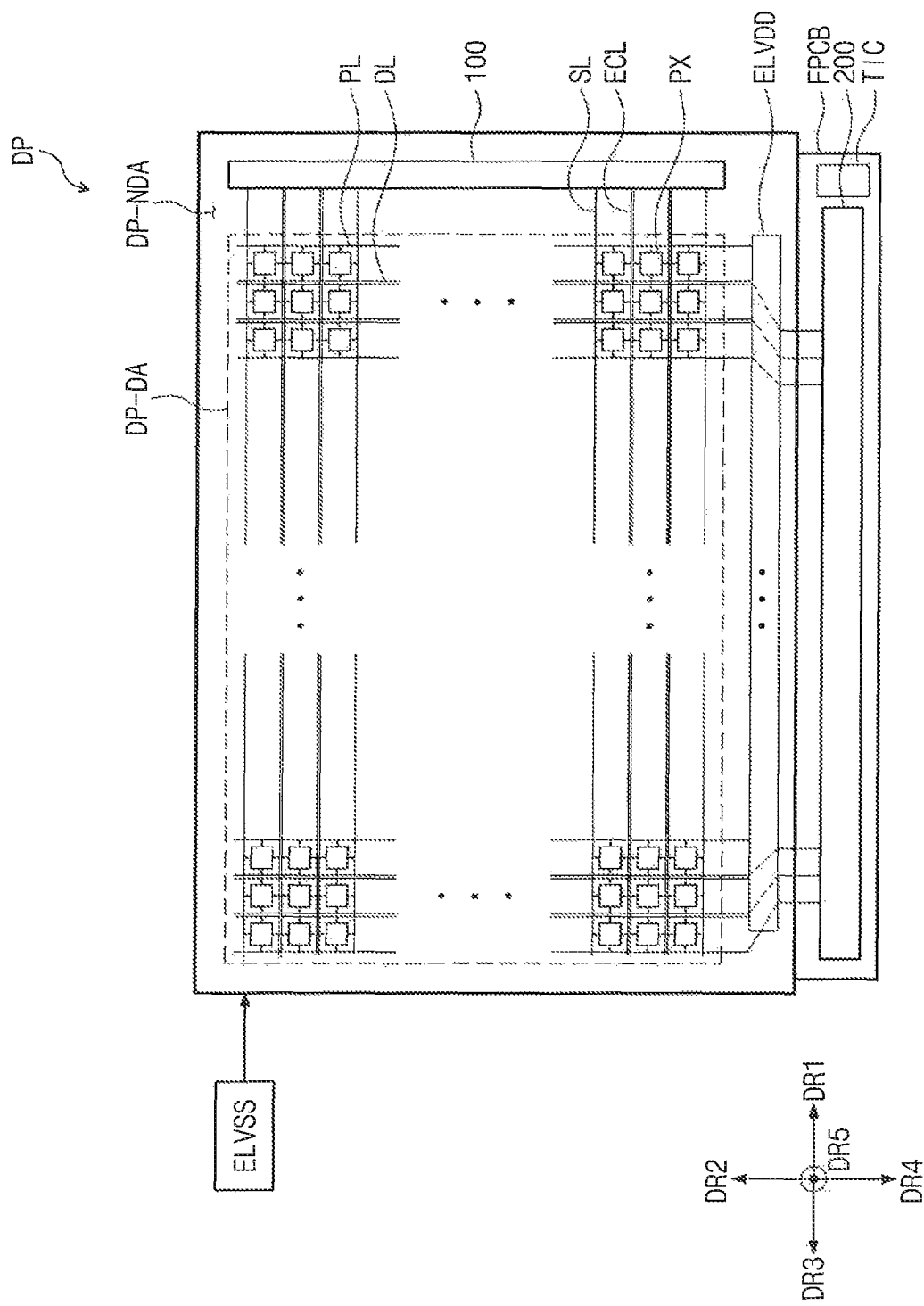
FIG. 5 illustrates a schematic diagram showing a display panel according to an embodiment of the present inventive concepts.
Figure 6:
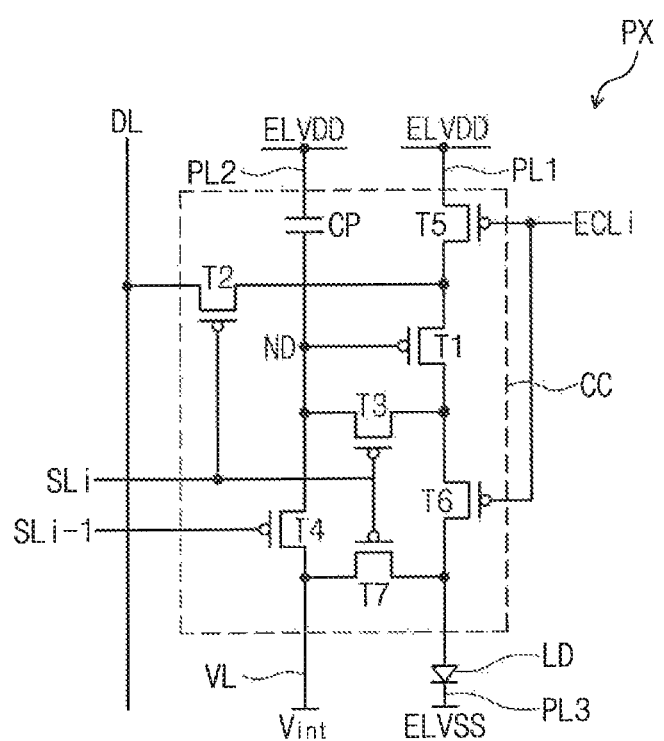
FIG. 6 illustrates an equivalent circuit diagram showing a pixel of FIG. 5 according to an embodiment of the present inventive concepts.

FIGS. 1 and 2 illustrate plan views showing a display device according to embodiments of the present inventive concepts. FIGS. 3 and 4 illustrate cross-sectional views taken along line A-A' of FIG. 1 showing a display device according to an embodiment of the present inventive concepts. FIG. 5 illustrates a schematic diagram showing a display panel according to an embodiment of the present inventive concepts. FIG. 6 illustrates an equivalent circuit diagram showing a pixel of FIG. 5.

FIGS. 1 and 2 each depict a display device DD according to an embodiment of the present inventive concepts. FIG. 1 shows the display device DD in a pre-stretch mode (referred to hereinafter as a "first mode"). FIG. 2 shows the display device DD in a stretched mode (referred to hereinafter as a "second mode") in a specific direction due to an externally applied force.

In an embodiment, the display device DD may be applicable not only to large-sized electronic products such as television sets and monitors, but to small and middle-sized electronic products such as portable phones, tablet PCs, automotive navigation systems, game consoles, and smart watches. However, embodiments of the present inventive concepts are not limited thereto and the display device DD may be applied to various other electronic products.

A display region DA and a non-display region NDA may be defined on the display device DD.

The display region DA on which an image IM is displayed is parallel to a plane defined by a first directional axis DR1 and a second directional axis DR2. A third directional axis DR3 indicates a direction opposite to that of the first directional axis DR1, and a fourth directional axis DR4 indicates a direction opposite to that of the second directional axis DR2.

A fifth directional axis DR5 indicates a normal direction to the display region DA, or a thickness direction of the display device DD. The fifth directional axis DR5 is used to differentiate from each other front and rear surfaces (e.g., top and bottom surfaces) of each member. The directions indicated by the first, second, third, fourth, and fifth directional axes DR1, DR2, DR3, DR4, and DR5 are relative concepts, and may thus be changed into other directions. In this description, the first, second, third, fourth, and fifth directional axes DR1, DR2, DR3, DR4, and DR5 respectively denote first, second, third, fourth, and fifth directions, and the same reference symbols are allocated.

FIG. 1 depicts a shape of the display region DA. However, embodiments of the present inventive concepts are not limited thereto. For example, the shape of the display region may be various other shapes, including circular, polygonal and irregular shapes.

The non-display region NDA is a section which is adjacent to the display region DA and on which the image IM is not displayed. The non-display region NDA may define a bezel region of the display device DD.

The non-display region NDA may surround the display region DA. For example, the non-display region NDA may completely surround the display region DA. However, embodiments of the present inventive concepts are not limited thereto, and the non-display region NDA may not surround one or more sides of the display region DA. The display region DA and the non-display region NDA may be relatively designed in shape.

FIGS. 3 and 4 are cross-sectional views of a display device DD and a display device DD-1, respectively, according to an embodiment of the present inventive concepts.

Referring to the embodiment of FIG. 3, the display device DD may include a stretchable substrate SS, a display panel DP, and an input sensor IS.

The shape of the stretchable substrate SS may be elongated or reduced in response to an external force. The stretchable substrate SS may have a first mode in which an external force is not yet applied and a second mode in which the stretchable substrate SS is elongated due to an external force. As the shape of the stretchable substrate SS is elongated or reduced, the display panel DP and the shape of the input sensor IS may each also be elongated or reduced. In this description below, the "first mode" may mean a state where the stretchable substrate SS is not elongated, and the "second mode" may mean a state where the stretchable substrate SS is elongated.

The display panel DP may include a plurality of pixels for displaying an image.

The input sensor IS may detect touch and/or pressure that are externally applied.

As shown in the embodiment of FIG. 3, the input sensor IS may be directly disposed on the display panel DP, such as on a thin encapsulation layer of the display panel DP. In this description, the phrase "directly disposed" may mean that the input sensor IS is disposed on the display panel DP with no separate adhesive member therebetween.

Referring to the embodiment of FIG. 4, the display device DD-1 may include a stretchable substrate SS, a display panel DP, an input sensor IS, and an adhesive member AD. The display panel DP and the input sensor IS may be attached to each other through the adhesive member AD which is disposed between the display panel DP and the input sensor IS (e.g., in the fifth direction DR5).

FIG. 5 depicts a display panel DP according to an embodiment of the present inventive concepts.

As shown in the embodiment of FIG. 5, the display panel DP includes a display region DP-DA and a non-display region DP-NDA, when viewed in a plan view. In an embodiment, the non-display region DP-NDA may be defined along an outer boundary of the display region DP-DA. The display region DP-DA and the non-display region DP-NDA of the display panel DP may respectively correspond to the display region DA and the non-display region NDA of the display device DD shown in the embodiment of FIG. 1.

The display panel DP may include a scan driver 100, a data driver 200, a plurality of scan lines SL, a plurality of emission control lines ECL, a plurality of data lines DL, a plurality of power lines PL, and a plurality of pixels PX. The pixels PX are disposed on the display region DP-DA. Each of the pixels PX includes a light emitting element (see LD of FIG. 6) and a pixel circuit (see CC of FIG. 6) connected to the light emitting element LD.

In an embodiment, the scan driver 100 may include a scan driving part and an emission control driving part.

The scan driving part generates scan signals, and sequentially outputs the generated scan signals to the scan lines SL. The emission control driving part generates emission control signals, and outputs the generated emission control signals to emission control lines ECL.

However, embodiments of the present inventive concepts are not limited thereto. For example, in another embodiment of the present inventive concepts, the scan driving part and the emission control driving part may be provided as a single circuit which are not distinguished from each other.

In an embodiment, the scan driver 100 may include a plurality of thin-film transistors formed by one of a low temperature polycrystalline silicon (LTPS) process and a low temperature polycrystalline oxide (LTPO) process each of which is the same as that used to form a driver circuit for the pixels PX.

The data driver 200 outputs data signals to the data lines DL. The data signals are analog voltages that correspond to gradation levels of image data.

In an embodiment of the present inventive concepts, the data driver 200 may be mounted on a printed circuit board FPCB, and the printed circuit board FPCB may be connected to pads disposed at ends of the data lines DL. However, embodiments of the present inventive concepts are not limited thereto, and the data driver 200 may be directly mounted on the display panel DP.

An input detection circuit TIC may be mounted on the printed circuit board FPCB. The input detection circuit TIC may be connected to the input sensor IS. In an embodiment, the input detection circuit TIC may be mounted on a separate circuit board other than the printed circuit board FPCB. However, embodiments of the present inventive concepts are not limited thereto and the input detection circuit TIC may be directly mounted on the input sensor IS. The input detection circuit TIC may control overall operations of sensing electrodes included in the input sensor IS.

As shown in the embodiment of FIG. 5, the scan lines SL may extend in the first direction DR1 and may be arranged in the second direction DR2. The scan lines SL may provide the pixels PX with the scan signals.

The emission control lines ECL may extend in the first direction DR1 and may be arranged in the second direction DR2. For example, each of the emission control lines ECL may be arranged parallel to a corresponding one of the scan lines SL. The emission control lines ECL may provide the pixels PX with the emission control signals.

The data lines DL may extend in the second direction DR2 and may be arranged in the first direction DR1. The data lines DL may provide corresponding pixels PX with the data signals.

The power lines PL may extend in the second direction DR2 and may be arranged in the first direction DR1. The power lines PL may provide corresponding pixels PX with a first power ELVDD.

Each of the pixels PX may be coupled to a corresponding one of the scan lines SL, a corresponding one of the emission control lines ECL, a corresponding one of the data lines DL, and a corresponding one of the power lines PL.

A second power ELVSS may be provided to the pixels PX of the display panel DP.

FIG. 6 illustrates an equivalent circuit diagram showing a pixel PX according to an embodiment of the present inventive concepts. FIG. 6 depicts by way of example the pixel PX connected to an $i^{th}$ scan line SLi and an $i^{th}$ emission control line ECLi.

The pixel PX may include a light emitting element LD and a pixel circuit CC. The pixel circuit CC may include a plurality of transistors, such as first to seventh transistors T1 to T7 and a capacitor CP. In response to a data signal, the pixel circuit CC controls an amount of current that flows through the light emitting element LD.

In response to the amount of current provided from the pixel circuit CC, the light emitting element LD may emit light with certain brightness. For example, a first power ELVDD may be set to a higher level than that of a second power ELVSS.

Each of the plurality of transistors, such as the first to seventh transistors T1 to T7, may include an input electrode (e.g., a source electrode), an output electrode (e.g., a drain electrode), and a control electrode (e.g., a gate electrode). For convenience in this description, one of the input and output electrodes may be called a first electrode, and the other of the input and output electrodes may be called a second electrode.

The first electrode of the first transistor T1 is coupled through the fifth transistor T5 with the first power ELVDD, and the second electrode of the first transistor T1 is coupled through the sixth transistor T6 to an anode electrode of the light emitting element LD. In this description, the first transistor T1 may be called a driving transistor.

In response to a voltage applied to the control electrode, the first transistor T1 controls an amount of current that flows through the light emitting element LD.

The second transistor T2 is coupled between the data line DL and the first electrode of the first transistor T1. The control electrode of the second transistor T2 is coupled to the $i^{th}$ scan line SLi. When the $i^{th}$ scan line SLi is provided with an $i^{th}$ scan signal, the second transistor T2 is turned on to electrically couple the data line DL to the first electrode of the first transistor T1.

The third transistor T3 is coupled between the second and control electrodes of the first transistor T1. The control electrode of the third transistor T3 is coupled to the i" scan line SLi. When the i" scan line SLi is provided with the i" scan signal, the third transistor T3 is turned on to electrically couple the second electrode of the first transistor T1 to the control electrode of the first transistor T1. Accordingly, when the third transistor T3 is turned on, the first transistor T1 is coupled in a diode type.

The fourth transistor T4 is coupled between a node ND and an initialization power generator. The control electrode of the fourth transistor T4 is coupled to an $(i-1)^{th}$ scan line SLi−1. When the $(i-)^{th}$ scan line SLi−1 is provided with an $(i-1)^{th}$ scan signal, the fourth transistor T4 is turned on to provide the node ND with an initialization voltage Vint.

The fifth transistor T5 is coupled between a first power line PL1 and the first electrode of the first transistor T1. The control electrode of the third transistor T3 is coupled to the $i^{th}$ emission control line ECLi.

The sixth transistor T6 is coupled between the second electrode of the first transistor T1 and the anode electrode of the light emitting element LD. The control electrode of the sixth transistor T6 is coupled to the $i^{th}$ emission control line ECLi.

The seventh transistor T7 is coupled between the initialization power generator and the anode electrode of the light emitting element LD. The control electrode of the seventh transistor T7 is coupled to the $i^{th}$ scan line SLi. When the $i^{th}$ scan line SLi is provided with the $i^{th}$ scan signal, the seventh transistor T7 provides the initialization voltage Vint to the anode electrode of the light emitting element LD.

The seventh transistor T7 may increase the capability of the pixel PX in representing black. For example, when the seventh transistor T7 is turned on, parasitic capacitance is discharged from the light emitting element LD. When back brightness is implemented, a leakage current from the first transistor T1 may not allow the light emitting element LD to emit light, and as a result, the pixel PX may have an increased capability of representing black.

In addition, the embodiment of FIG. 6 shows that the control electrode of the seventh transistor T7 is coupled to the $i^{th}$ scan line SLi. However, embodiments of the present inventive concepts are not limited thereto. For example, in an embodiment, the control electrode of the seventh transistor T7 may be coupled to the $(i-1)^{th}$ scan line SLi−1 or an $(i+1)^{th}$ scan line.

FIG. 6 depicts an example including PMOS transistors. However, embodiments of the present inventive concepts are not limited thereto and the pixel PX may be configured to include NMOS transistors. In an embodiment of the present inventive concepts, the pixel PX may be configured to include a combination of NMOS and PMOS transistors.

The capacitor CP is disposed between the second power line PL2 and the node ND. The capacitor CP stores a voltage that corresponds to a data signal. When the fifth transistor T5 and the sixth transistor T6 are turned on in response to the voltage stored in the capacitor CP, it may determine an amount of current that flows through the first transistor T1.

However, embodiments of the present inventive concepts are not limited to structure of the pixel PX shown in FIG. 6. For example, the pixel PX may be implemented in various configurations suitable for the light emitting element LD to emit light.

In an embodiment of the present inventive concepts, the light emitting element LD may be an organic light emitting element, a micro-led, or an emission element that uses a quantum-dot.

Figure 7A:
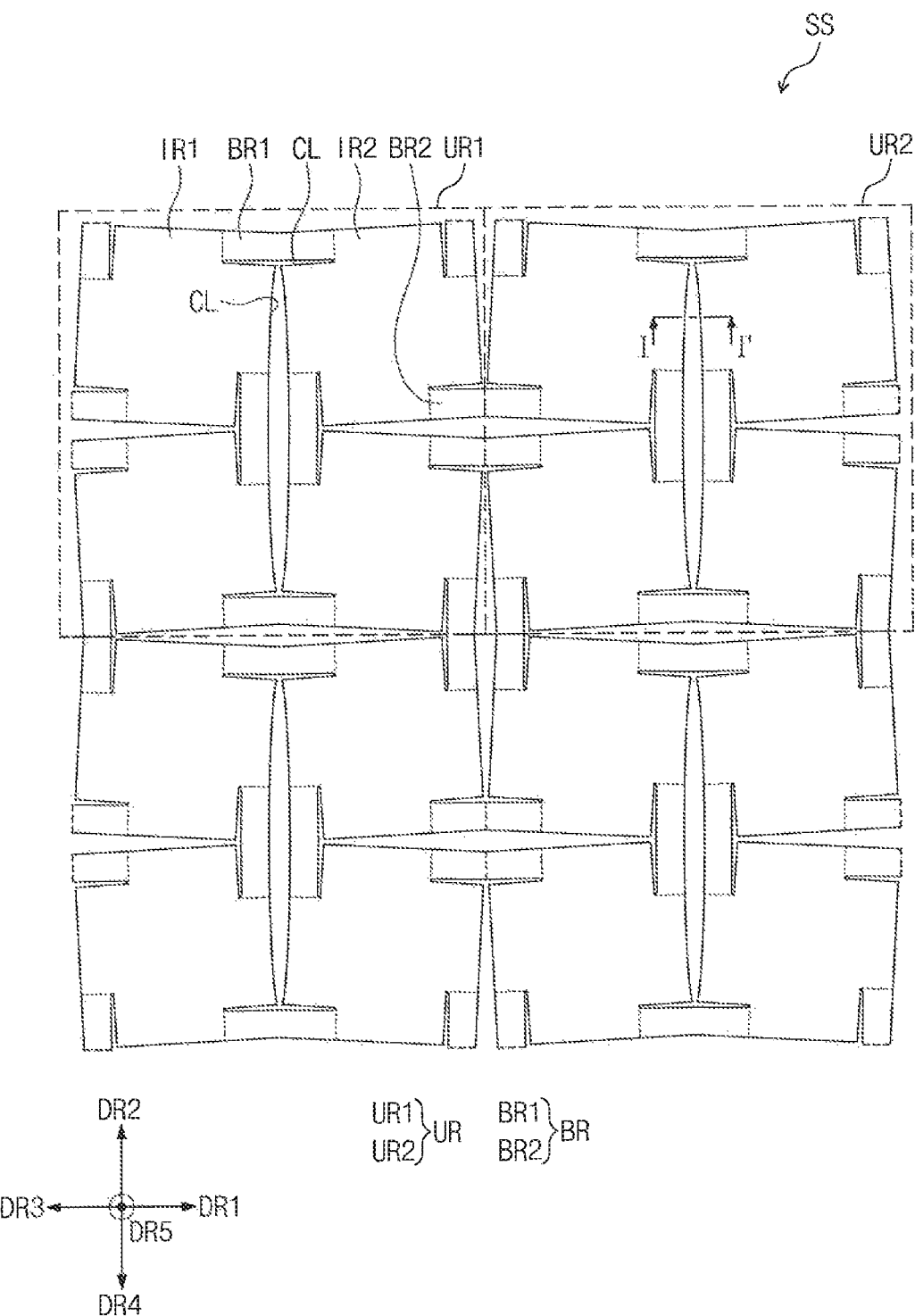
FIGS. 7A and 7B illustrate plan views showing a stretchable substrate according to embodiments of the present inventive concepts.
Figure 7B:
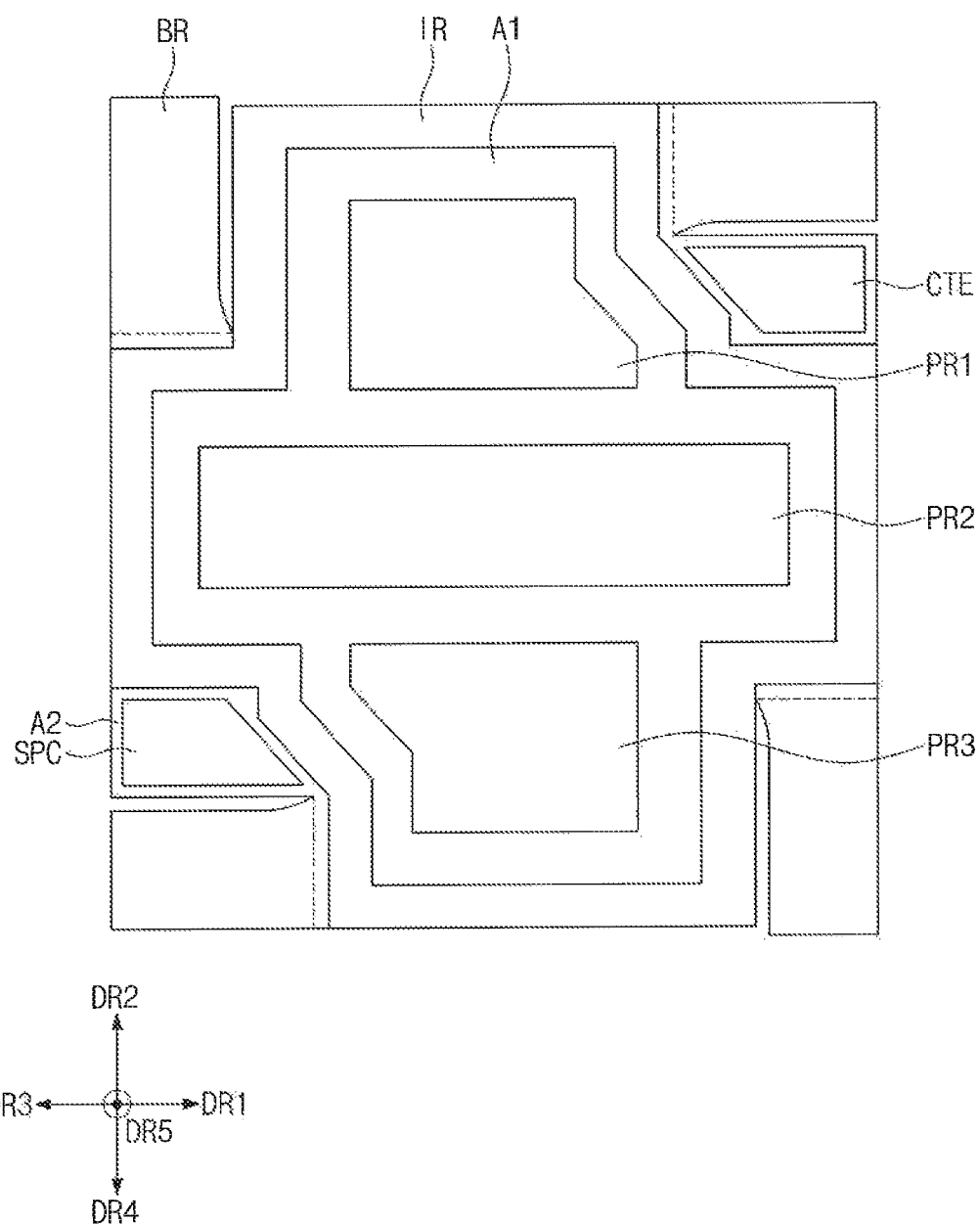

FIGS. 7A and 7B illustrate plan views showing a stretchable substrate according to embodiments of the present inventive concepts.

FIGS. 7A and 7B partially depict a stretchable substrate included in a display device according to embodiments of the present inventive concepts. For example, FIG. 7B shows one island region and bridge regions connected thereto when a stretchable substrate is not stretched.

The stretchable substrate SS may be a structure that supports pixels and the like, and may be stretchable to extend or contract in one direction.

The stretchable substrate SS may be formed of a dielectric material, such as resin. In addition, the stretchable substrate SS may be formed of a material with flexibility that enables the stretchable substrate SS to be bendable or foldable, and may have a single-layered or multi-layered structure.

For example, in an embodiment, the stretchable substrate SS may include one or more compounds selected from polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

Referring to the embodiments of FIGS. 7A and 7B, the stretchable substrate SS may include first and second island regions IR1 and IR2 and bridge regions BR. The first and second island regions IR1, IR2, and the bridge regions BR are distinguished from each other by a cutout part CL. The cutout part CL may be an opening formed by removing a portion of the stretchable substrate SS. For example, as shown in the embodiment of FIG. 7B, the stretchable substrate SS may have a shape in which the bridge regions BR connected to an edge of one of the first and second island regions IR1, IR2 are arranged along the first direction DR1 and the second direction DR2 and connect the first and second island regions IR1, IR2 to each other.

A pixel structure (e.g., thin-film transistor, capacitor, organic light emitting diode, etc.) may be formed on each of the first and second island regions IR1 and IR2, and a single pixel or a plurality of pixels may be formed.

Wiring lines may be formed on each bridge region BR. The wiring lines may supply the pixel structure with power voltages, data signals, and scan signals.

When the stretchable substrate SS is stretched, the bridge regions BR may be elongated to increase an interval between the first and second island regions IR1 and IR2. In this embodiment, the cutout part CL may have an increased area when the stretchable substrate SS is stretched. The increase in the interval between the first and second island regions IR1 and IR2 may induce an increase in area of each of the first and second island regions IR1 and IR2. However, embodiments of the present inventive concepts are not limited thereto and each of the first and second island regions IR1 and IR2 may not change in shape when the stretchable substrate SS is stretched. When no change is observed on the shapes of the first and second island regions IR1 and IR2, there may be no change on shapes of pixels formed on the first and second island regions IR1 and IR2.

In an embodiment, the stretchable substrate SS has a structure that is stretchable in its entirety. However, embodiments of the present inventive concepts are not limited thereto, and the stretchable substrate SS may have a structure that is stretchable in at least a partial portion thereof and a partial portion thereof may not be stretchable.

FIG. 7B illustrates a plan views showing some components applied to a display device according to an embodiment of the present inventive concepts. For convenience of description, FIG. 7B depicts a single island region IR and a plurality of bridge regions BR connected thereto. In addition, for convenience of description, FIG. 7B shows first to third emission regions PR1 to PR3 of each pixel, a spacer SPC, and a contact electrode CTE that are chosen among components formed on one island region IR.

Referring to the embodiment of FIG. 7B, the island region IR may include a first emission region PR1, a second emission region PR2, and a third emission region PR3. The first, second, and third emission regions PR1, PR2, and PR3 may be correspondingly defined on a plurality of display sections of the display panel DP.

For a display device according an embodiment of the present inventive concepts, each island region IR may be provided thereon with a plurality of pixels (see PX of FIG. 5), such as a pixel PX that emits red light, a pixel PX that emits blue light, and a pixel PX that emits green light.

For example, the first emission region PR1 may correspond to an organic light emitting layer of the pixel PX that emits the red light, the second emission region PR2 may correspond to an organic light emitting layer of the pixel PX that emits the blue light, and the third emission region PR3 may correspond to an organic light emitting layer of the pixel PX that emits the green light. However, embodiments of the present inventive concepts are not limited thereto. For example, the colors emitted by the first to third emission regions PR1 to PR3 may vary. The first to third emission regions PR1 to PR3 may have positions and shapes that are defined by a pixel definition layer which will be discussed below.

In an embodiment, the first and third emission regions PR1 and PR3 may have the same shape, and the shape of each of the first and third emission regions PR1 and PR3 may be symmetrical in the second direction DR2 to the shape of the third emission region PR3. In addition, the first and third emission regions PR1 and PR3 may be disposed symmetrical to each other in the first direction DR1.

As illustrated in the embodiment of FIG. 7B, the first and third emission regions PR1 and PR3 may be formed to have shapes which correspond to that of the island region IR.

The second emission region PR2 may be positioned between the first and third emission regions PR1 and PR3, and may have an area that is greater than that of each of each of the first and third emission regions PR1 and PR3.

As shown in the embodiment of FIG. 7B, the island region IR may include a first section A1 and a second section A2.

The first section A1 may be an inner part of the island region IR. The first section A1 may include the first emission region PR1, the second emission region PR2, and the third emission region PR3.

The second section A2 may be an outer part of the island region IR. As shown in the embodiment of FIG. 7B, the second section A2 may include the spacer SPC and the contact electrode CTE.

Figure 8:
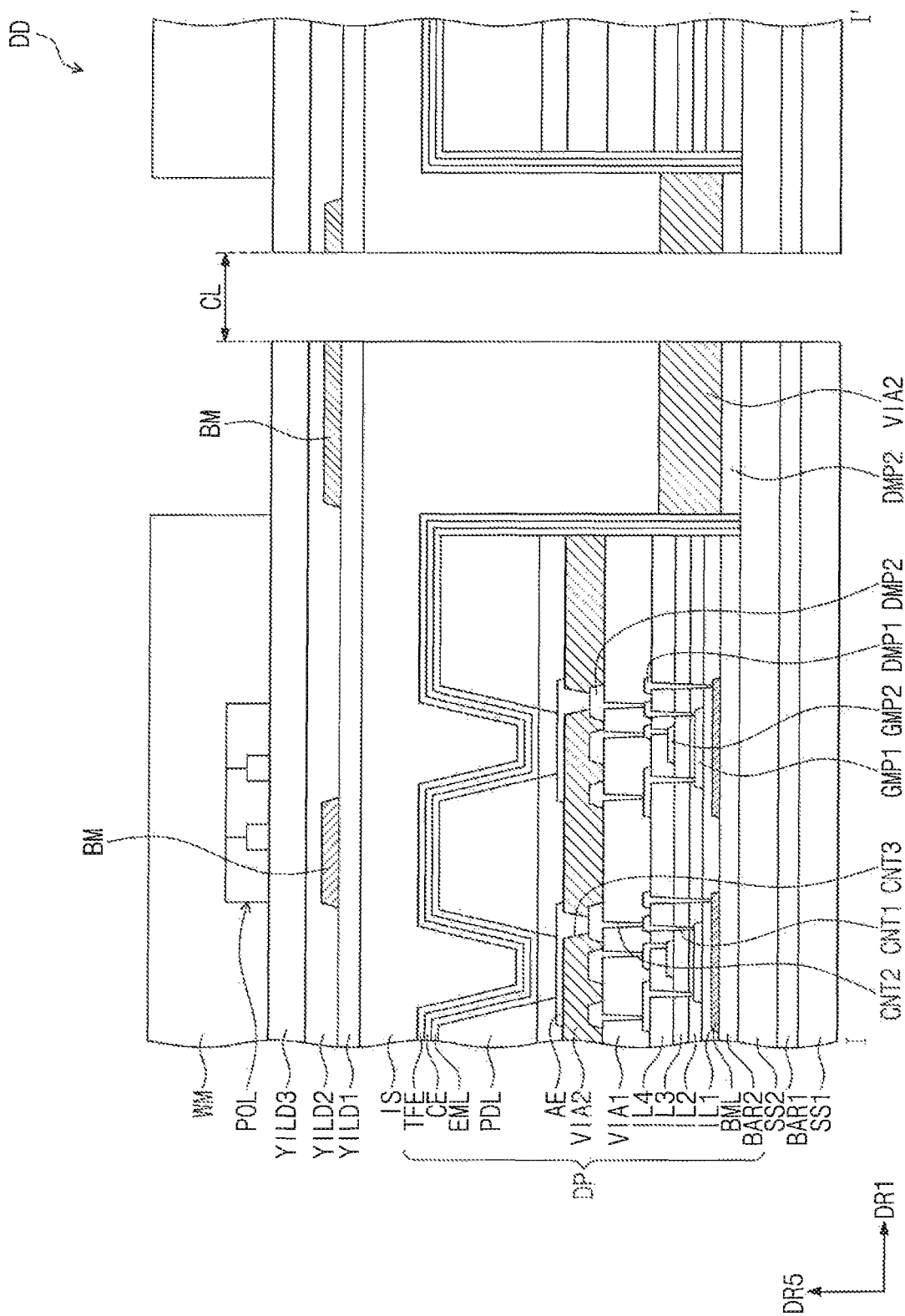
FIG. 8 illustrates a cross-sectional view taken along line I-I' of FIG. 7A showing a display device according to an embodiment of the present inventive concepts.

FIG. 8 illustrates a cross-sectional view showing a display device according to an embodiment of the present inventive concepts. FIG. 8 depicts a cross-section of the display device DD taken along line I-I' of FIG. 7A.

Referring to FIG. 8, the display device DD may include first and second stretchable substrates SS1 and SS2, a display panel DP, an input sensor IS, and a window WM.

As shown in the embodiment of FIG. 8, the stretchable substrates include a plurality of stretchable substrates, such as a first stretchable substrate SS1 and a second stretchable substrate SS2. A plurality of barrier layers, such as first barrier layer BAR1 and a second barrier layer BAR2 may be disposed between the plurality of stretchable substrates, such as the first and second stretchable substrates SS1 and SS2. The stretchable substrates, such as the first and second stretchable substrates SS1 and SS2, may provide the display panel DP with a base layer. The plurality of barrier layers, such as the first and second barrier layers BAR1 and BAR2, may include a buffer layer. The display panel DP may be disposed on the stretchable substrates, such as the first and second stretchable substrates SS1 and SS2. The display panel DP may include a plurality of dielectric layers, such as first to fourth dielectric layers IL1 to IL4. A plurality of organic layers, such as first and second organic layers VIA1 and VIA2, may be disposed on the plurality of dielectric layers, such as the first to fourth dielectric layers IL1 to IL4. The plurality of organic layers, such as the first and second organic layers VIA1 and VIA2, may include a passivation layer.

The first to fourth dielectric layers IL1 to IL4 may be provided thereon with a plurality of gate metal patterns, such as first and second gate patterns GMP1 and GMP2, and a plurality of data metal patterns, such as first and second data metal patterns DMP1 and DMP2. The plurality of gate metal patterns, such as the first and second gate metal patterns GMP1 and GMP1, and the plurality of data metal patterns, such as the first and second data metal patterns DMP1 and DMP2, may overlap the island region (see IR of FIG. 7B). A plurality of contact holes, such as first to third contact holes CNT1 to CNT3, may be defined in the plurality of dielectric layers, such as the first to fourth dielectric layers IL1 to IL4. The first to third contact holes CNT1 to CNT3 may be used to correspondingly connect the first and second gate metal patterns GMP1 and GMP2 to the first and second data metal patterns DMP1 and DMP2. While the embodiment of FIG. 8 shows two stretchable substrates, four dielectric layers, two organic layers, two data metal patterns and three contact holes, embodiments of the present inventive concepts are not limited thereto and the number of each of these elements may vary.

The display panel DP may include an anode electrode AE, a pixel definition layer PDL, an emission layer EML, and a cathode electrode CE stacked on each other (e.g., in the fifth direction DR5). The anode electrode AE, the pixel definition layer PDL, the emission layer EML, and the cathode electrode CE may define a light emitting element of the display panel DP.

The anode electrode AE may be disposed on the second organic layer VIA2 (e.g., direction in the fifth direction DR5). The anode electrode AE may be electrically connected to a second data metal pattern DMP2 through a third contact hole CNT3 of a second organic layer VIA2.

The pixel definition layer PDL may be disposed on the second organic layer VIA2, and may expose at least a portion of the anode electrode AE.

The emission layer EML may be disposed on the anode electrode AE.

In an embodiment in which the light emitting element is an organic light emitting diode (OLED), the emission layer EML may include an organic material. However, embodiments of the present inventive concepts are not limited thereto. For example, in an embodiment in which the light emitting element is a micro-LED, the emission layer EML may include an inorganic material.

The cathode electrode CE may be disposed on the emission layer EML.

A thin encapsulation layer TFE may encapsulate the light emitting element of the display panel DP, and may thus protect the light emitting element against oxygen or moisture. In an embodiment, the thin encapsulation layer TFE may be a layer in which at least one organic layer and at least one inorganic layers are mixed with each other.

The input sensor IS may be disposed on the thin encapsulation layer TFE. For example, as shown in the embodiment of FIG. 8, the input sensor IS may be directly disposed on the thin encapsulation layer TFE (e.g., in the fifth direction DR5).

First to third interlayer dielectric layers YILD1 to YILD3 may be disposed on the input sensor IS. An antireflection layer POL may be disposed on the first to third interlayer dielectric layers YILD1 to YILD3. The window WM may be disposed on the first to third interlayer dielectric layers YILD1 to YILD3. For example, as shown in the embodiment of FIG. 8, a lower surface of the window WM may directly contact an upper surface of the third interlayer dielectric layer YILD3. A light-shield pattern BM may be disposed on one of the first to third interlayer dielectric layers YILD1 to YILD3. For example, as shown in the embodiment of FIG. 8, a lower portion of the light-shield pattern BM may directly contact an upper surface of the first interlayer dielectric layer YILD1. However, embodiments of the present inventive concepts are not limited thereto.

Figure 9A:
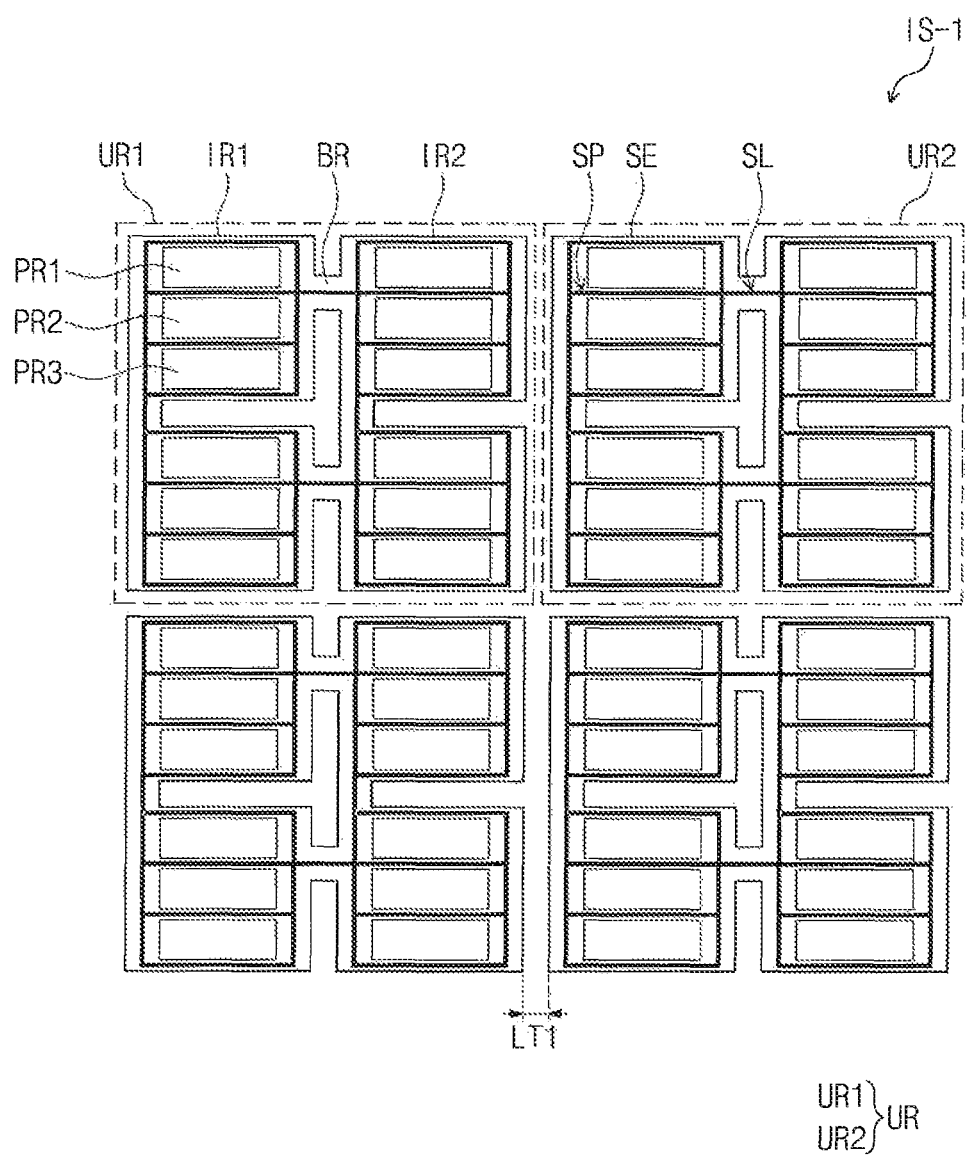

FIGS. 9A and 9B illustrate plan views showing an input sensor according to embodiments of the present inventive concepts. FIGS. 9A and 9B depict the stretchable substrate SS of the embodiments of FIGS. 7A and 7B. FIGS. 9A and 9B depict an input sensor that overlaps a plurality of unit regions UR of the stretchable substrate SS.

FIG. 9A shows an input sensor IS-1 when the stretchable substrate SS is in a first mode, and FIG. 9B shows an input sensor IS-2 when the stretchable substrate SS is in a second mode.

Referring to the embodiments of FIGS. 9A and 9B, the input sensor IS-1 or IS-2 may include a plurality of sensing electrodes SE. The plurality of sensing electrodes SE may be correspondingly disposed on a plurality of unit regions UR. Each of the plurality of sensing electrodes SE may include a sensing part SP that overlaps the island region IR, and may also include a connection part SL that is connected to the sensing part SP and overlaps the bridge region BR.

The plurality of sensing electrodes SE may have a mesh shape. In an embodiment, the plurality of sensing electrodes SE are formed to have a mesh shape which expose the first, second, and third emission regions PR1, PR2, and PR3.

FIG. 9A or 9B roughly depicts the sensing electrodes SE of the input sensor IS-1 or IS-2. The input sensor IS-1 or IS-2 may elongate when the stretchable substrate SS is stretched. FIG. 9A shows the input sensor IS-1 in a state in which it is not stretched, and FIG. 9B shows the input sensor IS-2 in a state in which it is stretched. For example, FIG. 9A exhibits the input sensor IS-1 in the first mode, and FIG. 9B exhibits the input sensor IS-2 in the second mode. A first distance LT1 between adjacent unit regions UR of a plurality of unit regions UR that correspondingly overlap the plurality of sensing electrodes SE included in the input sensor IS-1 in the first mode may be less than a second distance LT2 between adjacent unit regions UR of a plurality of unit regions UR that correspondingly overlap the plurality of sensing electrodes SE included in the input sensor IS-2 in the second mode. For example, the plurality of unit regions UR may be spaced apart and separated from each other when the stretchable substrate SS is in a stretched state (e.g., the second mode). Each of the plurality of unit regions UR may include a plurality of island regions, such as the first and second island regions IR1, IR2 and at least one bridge region BR which connect adjacent island regions to each other. For example, in the embodiment of FIG. 9A, each unit region UR includes four island regions and a plurality of bridge regions BR. However, embodiments of the present inventive concepts are not limited thereto and the numbers of the plurality of island regions and at least one bridge region BR included in each unit region UR may vary.

In an embodiment, a distance between adjacent island regions of a plurality of island regions IR in a unit region UR, such as first and second island regions IR1, IR2, may also be greater in the second mode than in the first mode. When the stretchable substrate SS is stretched, the input sensor IS-2 may have an increased length of the connection part SL that overlaps the bridge region BR which connects the adjacent first and second island regions IR1, IR2 to each other.

Figure 10A:
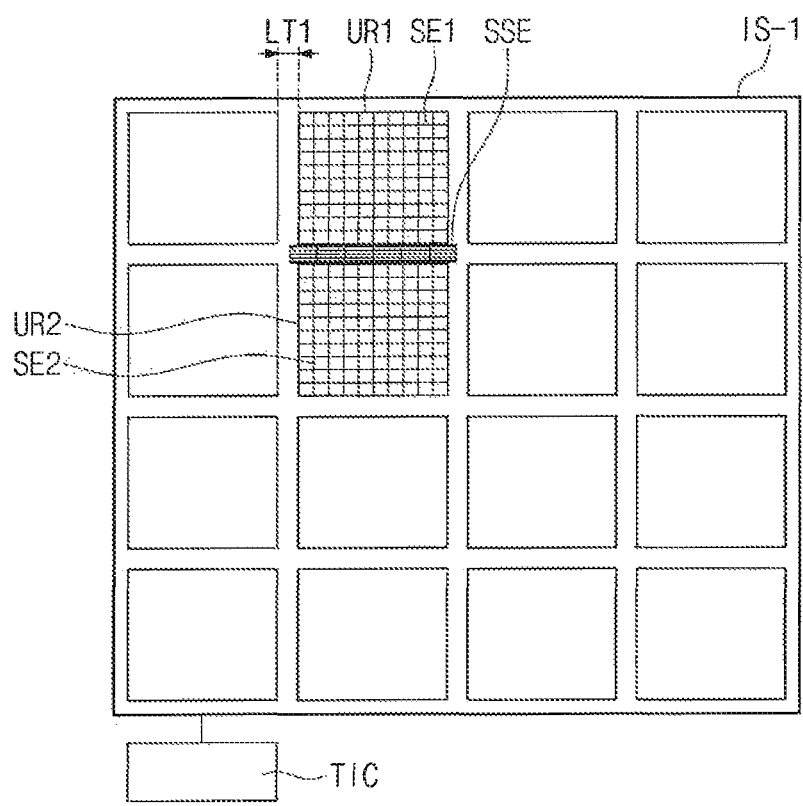
FIGS. 10A and 10B illustrate schematic diagrams showing an input sensor according to embodiments of the present inventive concepts.
Figure 10B:
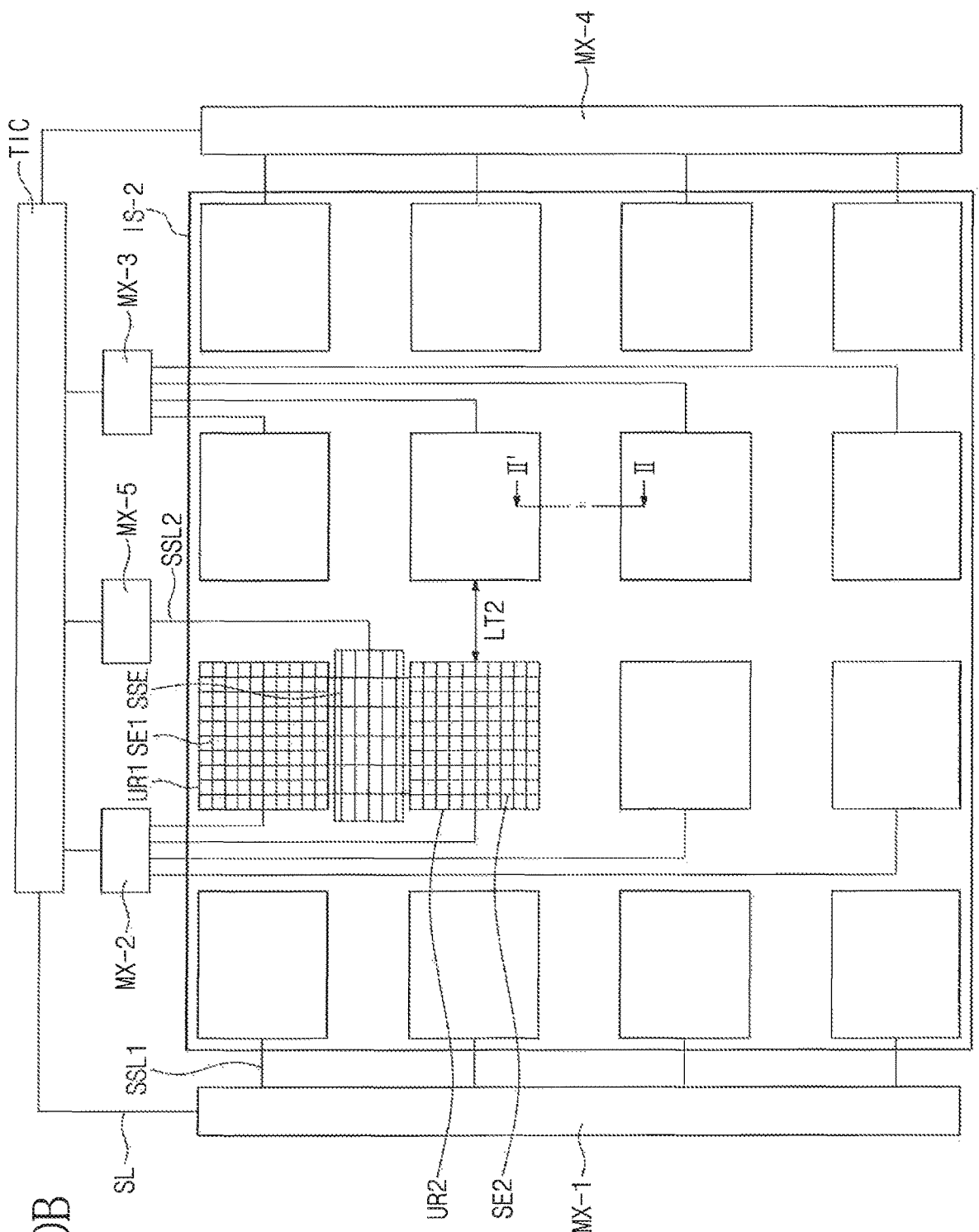

FIGS. 10A and 10B illustrate schematic diagrams showing an input sensor according to embodiments of the present inventive concepts. FIG. 10A shows an input sensor IS-1 when the stretchable substrate SS is in the first mode, and FIG. 10B shows an input sensor IS-2 when the stretchable substrate SS is in the second mode.

FIGS. 10A and 10B depict only one subsidiary electrode SSE disposed between a first sensing electrode SE1 and a second sensing electrode SE2. The subsidiary electrode SSE is selected from a plurality of subsidiary electrodes disposed between a plurality of sensing electrodes from which the first and second sensing electrodes SE1 and SE2 are selected. The first and second sensing electrodes SE1 and SE2 are illustrated as representatives of a plurality of sensing electrodes according to the present inventive concepts. The sensing electrodes of the present inventive concepts have a mesh shape. In an embodiment, the subsidiary electrode SSE may be disposed between every two adjacent sensing electrodes, such as shown with respect to the first and second sensing electrodes SE1, SE2.

Referring to the embodiments of FIGS. 10A and 10B, the input sensor IS-1 includes the first sensing electrode SE1 and the second sensing electrode SE2. The first sensing electrode SE1 may be disposed adjacent to the second sensing electrode SE2. The first sensing electrode SE1 and the second sensing electrode SE2 may be respectively disposed on a first unit region UR1 and a second unit region UR2 which are adjacent to each other. The subsidiary electrode SSE may be disposed between the first sensing electrode SE1 and the second sensing electrode SE2. In an embodiment, the first and second sensing electrodes SE1 and SE2 and the subsidiary electrode SSE may have a mesh shape.

As shown in the embodiment of FIG. 10B, the input sensor IS-1 or IS-2 may include first sensing lines SSL1 that are correspondingly connected to a plurality of sensing electrodes SE. The input sensor IS-1 or IS-2 may also include second sensing lines SSL2 that are correspondingly connected to a plurality of subsidiary electrodes SSE.

In an embodiment, the first sensing lines SSL1 may be correspondingly connected to a plurality of multiplexers, such as first to fourth multiplexers MX-1 to MX-4. However, embodiments of the present inventive concepts are not limited thereto and the number of the multiplexers that the first sensing lines SSL1 are connected to may vary. The first to fourth multiplexers MX-1 to MX-4 may be connected to the input detection circuit TIC of the printed circuit board FPCB. The second sensing line SSL2 may be connected to a separate multiplexer, such as the fifth multiplexer MX-5. FIG. 10B depicts only one subsidiary electrode SSE and the multiplexer MX-5 connected thereto. However, embodiments of the present inventive concepts are not limited thereto. For example, in an embodiment, the subsidiary electrode SSE between the first and second sensing electrodes SE1 and SE2 may be provided in plural on an entirety of an input sensor, and thus the multiplexer MX-S may also be provided in plural.

In an embodiment, a plurality of sensing electrodes, such as the first and second sensing electrodes SE1 and SE2, may have a plurality of coordinate data different from each other.

For example, in an embodiment, the first sensing electrode SE1 may have a coordinate data of (x2, y), and the second sensing electrode SE2 may have a coordinate data of (x2, y2). In an embodiment, no coordinate data may be provided to the subsidiary electrode SSE included in the input sensor IS-1 in the first mode. However, embodiments of the present inventive concepts are not limited thereto.

For example, in an embodiment, a coordinate data may be provided to the subsidiary electrode SSE included in the input sensor IS-1 in the first mode. For example, when the first sensing electrode SE1 has a coordinate data of (x2, y), and when the second sensing electrode SE2 has a coordinate data of (x2', y3'), the subsidiary electrode SSE between the first and second sensing electrodes SE1 and SE2 may have a coordinate data of (x2', y2'). However, in an embodiment, the subsidiary electrode SSE may be deactivated and thus the subsidiary electrode SSE may not detect an external input in the first mode.

FIG. 10B shows the input sensor IS-2 in the second mode. In the embodiment of FIG. 10B, as the stretchable substrate SS is stretched, the first and second sensing electrodes SE1 and SE2 may be spaced apart from each other. No electrical connection may be provided between the first sensing electrode SE1 and the second sensing electrode SE2. In the second mode, the subsidiary electrode SSE may be stretched (e.g., elongated) between the first sensing electrode SE1 and the second sensing electrode SE2. For example, a second area of the subsidiary electrode SSE in the second mode may be greater than a first area of the subsidiary electrode SSE in the first mode. In an embodiment, the subsidiary electrode SSE may be activated in the second mode. An area of the first sensing electrode SE1 in the second mode may be greater than an area of the first sensing electrode SE1 in the first mode, and the same may be true of the second sensing electrode SE2.

In an embodiment, in the first mode, the subsidiary electrode SSE may have no coordinate data, but in the second mode, an operating state of the subsidiary electrode SSE may be changed to allow a coordinate data. As the subsidiary electrode SSE has a coordinate data, one or more of the first and second sensing electrodes SE1 and SE2 may be remapped in their coordinate data. For example, in an embodiment, when the first sensing electrode SE1 and the second sensing electrode SE2 have their coordinate data of (x2, y) and (x2, y2), respectively, in the first mode, the subsidiary electrode SSE may be activated to have a coordinate data of (x2, y2) between the first and second sensing electrodes SE1 and SE2 in the second mode, with the result that the second sensing electrode SE2 may be remapped to have a coordinate data of (x2, y3). When the input sensor IS-1 in the first mode is changed into the input sensor IS-2 in the second mode, the input detection circuit TIC may activate a coordinate data of the subsidiary electrode SSE, and then may remap a coordinate data of one or more of the first and second sensing electrodes SE1 and SE2. However, embodiments of the present inventive concepts are not limited thereto.

For example, in an embodiment, when a coordinate data is provided to the subsidiary electrode SSE in the first mode, the subsidiary electrode SSE may maintain its coordinate data even in the second mode. Therefore, in the first and second modes, the first sensing electrode SE1 may have a coordinate data of (x2, y), the second sensing electrode SE2 may have a coordinate data of (x2, y2), and the subsidiary electrode SSE may have a coordinate data of (x2, y3). In this embodiment, in the second mode, the input detection circuit TIC may not perform the remapping of coordinate data, and instead may activate the subsidiary electrode SSE to detect an external input.

As shown in the embodiments of FIGS. 10A-10B, the first sensing electrode SE1 and the second sensing electrode SE2 may be spaced apart from each other a first distance LT1 in the first mode, and may be spaced apart from each other a second distance LT2 in the second mode. The first distance LT1 and the second distances LT2 that the first and second sensing electrodes SE2 are spaced apart from each other in the first and second modes, respectively, may be substantially the same as the first and second distances LT1, LT2 that the first and second units UR1, UR2 are spaced apart from each other in the first and second modes. The second distance LT2 may be greater the first distance LT1. In an embodiment, the first area of the subsidiary electrode SSE may be proportional to the first distance LT1, and the second area of the subsidiary electrode SSE may be proportional to the second distance LT2.

Figure 10C:
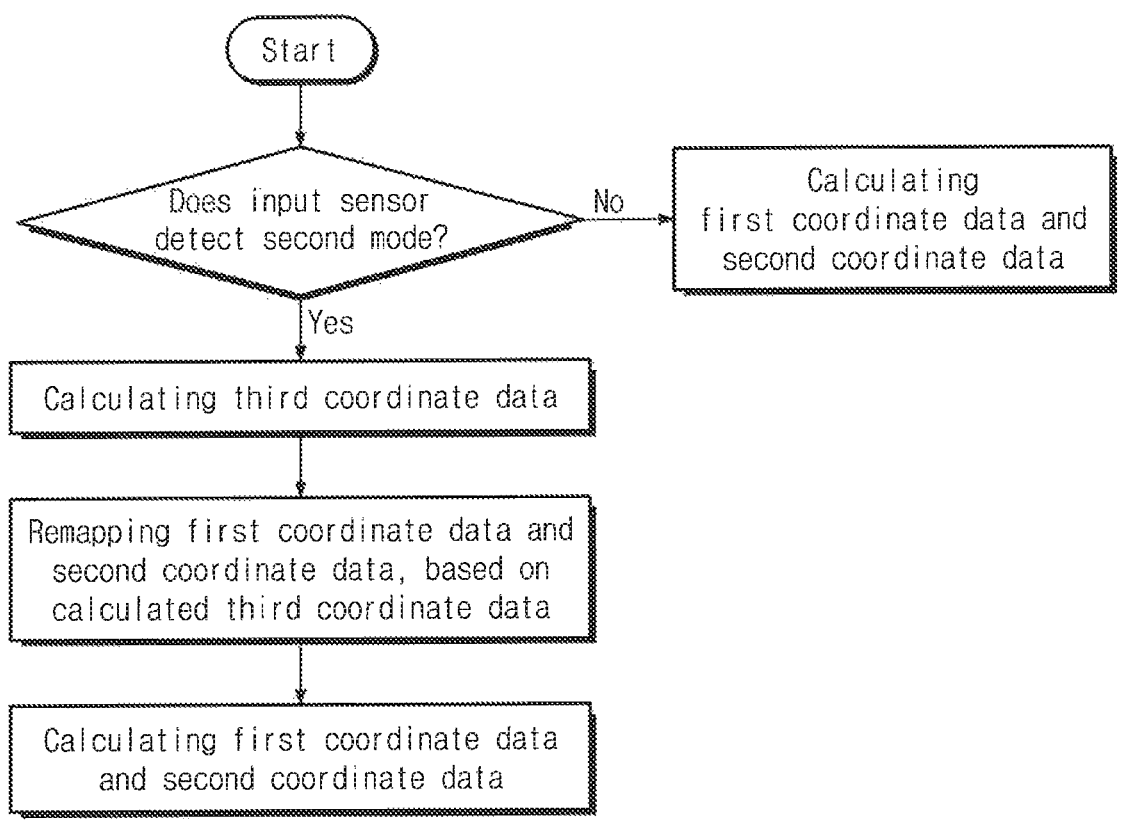
FIG. 10C illustrates a flow chart showing an operation of an input detection circuit according to an embodiment of the present inventive concepts.

FIG. 10C illustrates a flow chart showing an operation of an input detection circuit according to an embodiment of the present inventive concepts. With the reference to FIGS. 10A to 10C, when a plurality of sensing electrode detect an external input, the input detection circuit TIC may calculate a plurality of corresponding coordinate data. For example, in an embodiment, when the first sensing electrode SE1 detects an external input, such as user's touch, the input detection circuit TIC may calculate a coordinate data of (x2, y) that corresponds to the external input.

In an embodiment in which a coordinate data is provided to the subsidiary electrode SSE in the first mode, when an external input is detected in the second mode, a third coordinate data of (x2, y2) may be calculated for the activated subsidiary electrode SSE, a first coordinate data of (x2, y) for the first sensing electrode SE1, and a second coordinate date of (x2, y3) for the second sensing electrode SE2.

In an embodiment in which no coordinate data is provided to the subsidiary electrode SSE in the first mode, when an external input is detected in the first mode, there may be calculated a first coordinate data of (x2, y) for the first sensing electrode SE1 and a second coordinate data of (x2, y2) for the second sensing electrode SE2.

In contrast, when an external input is detected in the second mode, the subsidiary electrode SSE may be activated by the input detection circuit TIC, and a third coordinate data of (x2, y2) may be calculated. When the third coordinate data of (x2, y2) is calculated, one or more of the first and second coordinate data may be remapped based on the calculated third coordinate data of (x2, y2). For example, the second coordinate data may be changed into (x2, y3). In response to an external input, the input detection circuit TIC may calculate remapped first to third coordinate data.

In an embodiment, the display device DD may include a strain gauge by which either the first mode or the second mode is determined when an external input is detected. The strain gauge may be disposed on the stretchable substrate SS. The input detection circuit TIC may receive information about whether the stretchable substrate SS is in the first or second mode from the strain gauge, and may activate the subsidiary electrode SSE when the second mode is detected.

Figure 11A:
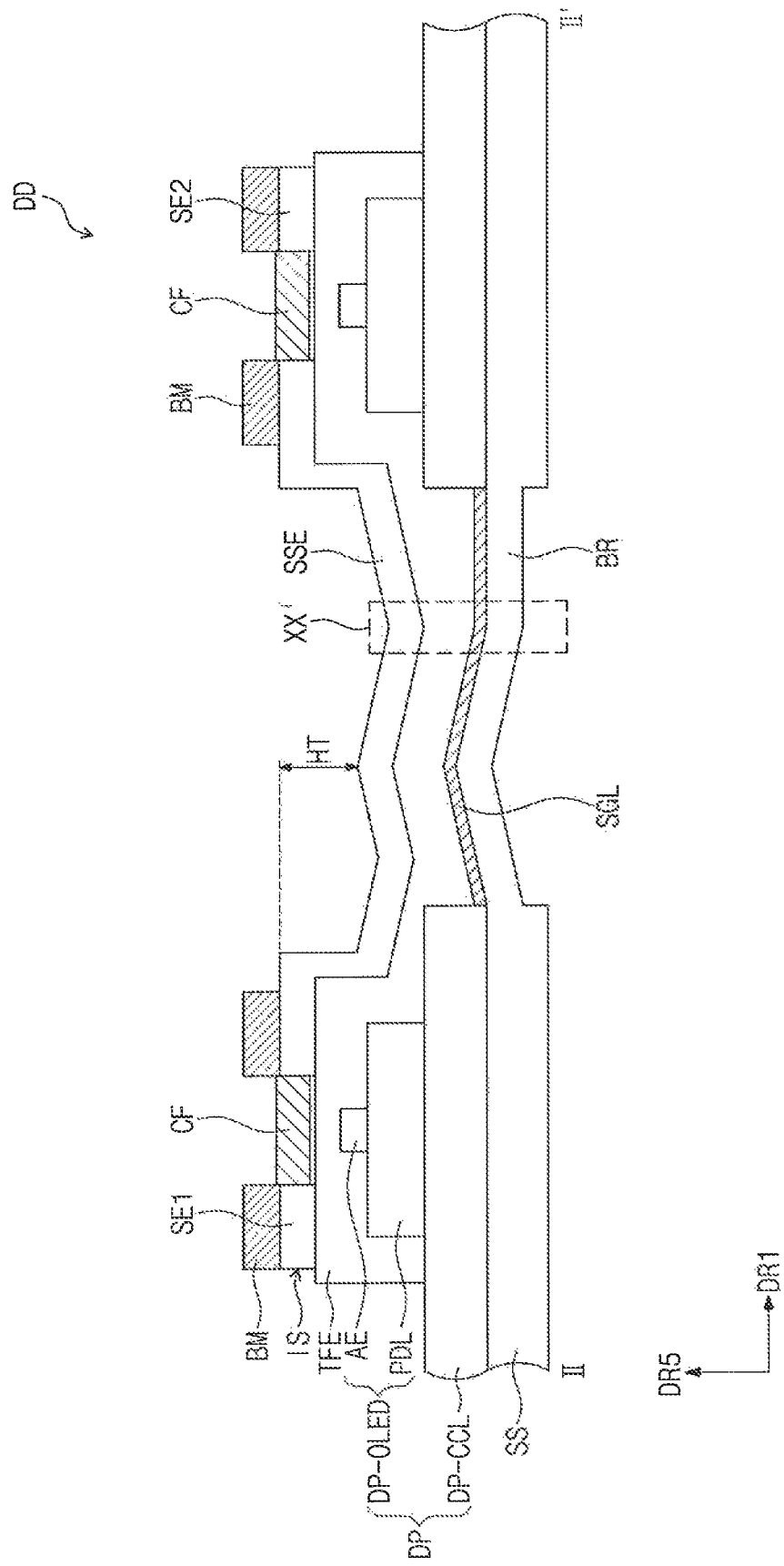
FIGS. 11A and 11C illustrate cross-sectional views taken along line II-II' of FIG. 10B showing a display device according to embodiments of the present inventive concepts.
Figure 11B:
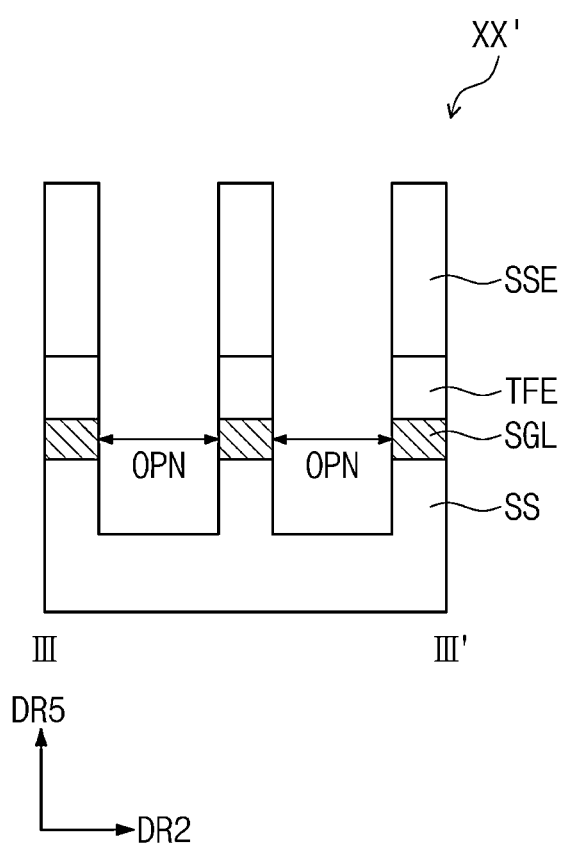
FIG. 11B illustrates an enlarged cross-sectional view of area XX' of FIG. 11A taken along line III-III' of FIG. 12C according to an embodiment of the present inventive concepts.
Figure 11C:
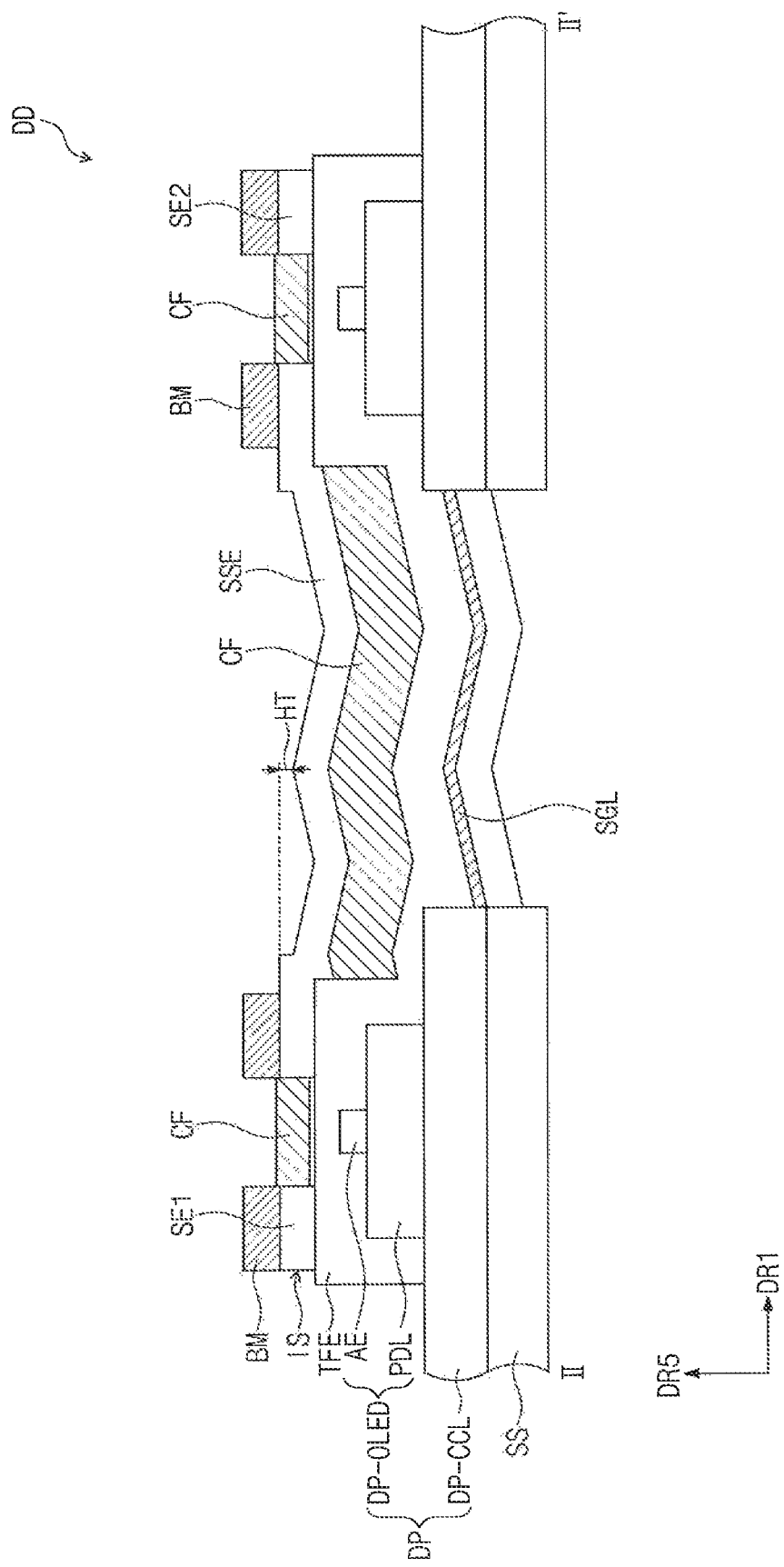

FIGS. 11A to 11C illustrate cross-sectional views showing a display device according to embodiments of the present inventive concepts. FIGS. 11A and 11C depict cross-sections taken along line II-II' of the display device DD that includes the input sensor IS-2 of FIG. 10B.

Referring to the embodiments of FIGS. 11A to 11C, the display device DD may include a stretchable substrate SS, a circuit layer DP-CCL, an emission layer DP-OLED, a thin encapsulation layer TFE, an input sensor IS, a color filter CF, and a light-shield pattern BM. The circuit layer DP-CCL and the emission layer DP-OLED may be included in a display panel DP. The circuit layer DP-CCL may be disposed on the stretchable substrate SS, and the emission layer DP-OLED may be disposed on the circuit layer DP-CCL. For example, as shown in the embodiment of FIG. 11A, the circuit layer DP-CCL may be disposed directly on the stretchable substrate SS (e.g., in the fifth direction DR5) and the emission layer DP-OLED may be disposed directly on the circuit layer DP-CCL (e.g., in the fifth direction DR5). The input sensor IS may be disposed on the thin encapsulation layer TFE (e.g., directly on in the fifth direction DR5). The color filter CF may be disposed on the emission layer DP-OLED. The light-shield pattern BM may be disposed on the input sensor IS (e.g., directly on in the fifth direction DR5).

As shown in the embodiment of FIG. 11A, the input sensor IS may include a first sensing electrode SE1 and a second electrode SE2, and may also include a subsidiary electrode SSE disposed between the first and second sensing electrodes SE1 and SE2 (e.g., in the first direction DR1). The first and second sensing electrodes SE1 and SE2 may be directly disposed on the thin encapsulation layer TFE that is disposed on the emission layer DP-OLED. The subsidiary electrode SSE may overlap a plurality of wiring parts SGL of the display panel DP. The plurality of wiring parts SGL may be disposed between island regions, such as the first and second island regions IR1, IR2, and may connect a plurality of display parts that overlap (e.g., in the fifth direction DR5) the first and second island regions IR1, IR2 to each other. For example, the plurality of wiring parts SGL may be disposed between adjacent unit regions of the display panel DP.

FIG. 11B illustrates an enlarged view of area XX' of FIG. 11A. Referring to FIG. 11B, the plurality of wiring parts SGL may be patterned to be stretchable. For example, in an embodiment, the plurality of wiring parts SGL may be patterned together with the subsidiary electrode SSE and may have a mesh shape. FIG. 11B shows a portion of the patterned shapes of each wiring part SGL. A plurality of open regions OPN may be defined in the wiring parts SGL and the subsidiary electrode SSE. For example, the plurality of open regions OPN may correspond to mesh-type openings. FIG. 11C illustrates a plan view that corresponds to the cross-section of FIG. 11B.

As shown in FIG. 11C, the color filter CF may be disposed between the subsidiary electrode SSE and the wiring parts SGL (e.g., in the fifth direction DR5). The color filter CF may reduce step differences in thickness directions of the subsidiary electrode SSE and the first and second sensing electrodes SE1 and SE2. For example, the color filter CF may reduce a height difference HT between the subsidiary electrode SSE and the first and second sensing electrodes SE1 and SE2. In this description, the term "height" may correspond to a length in the fifth direction DR5.

Figure 12A:
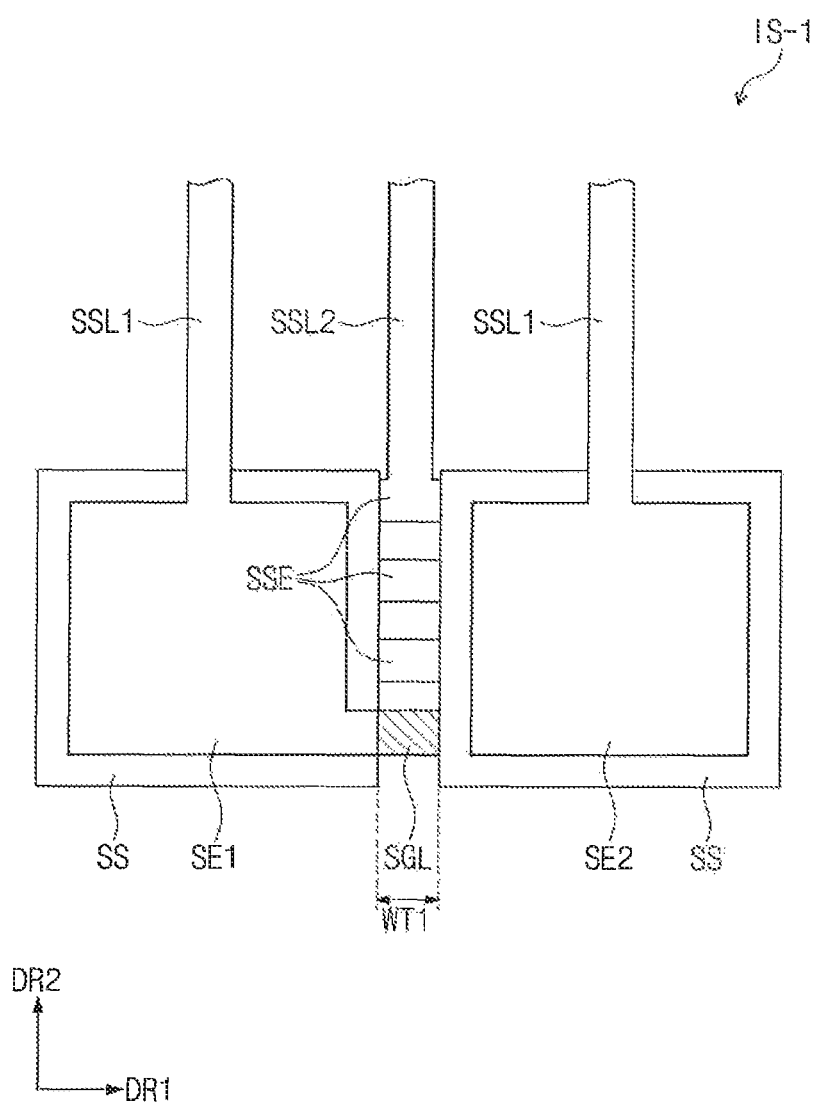
FIGS. 12A to 12C illustrate plan views showing an input sensor according to embodiments of the present inventive concepts.
Figure 12B:
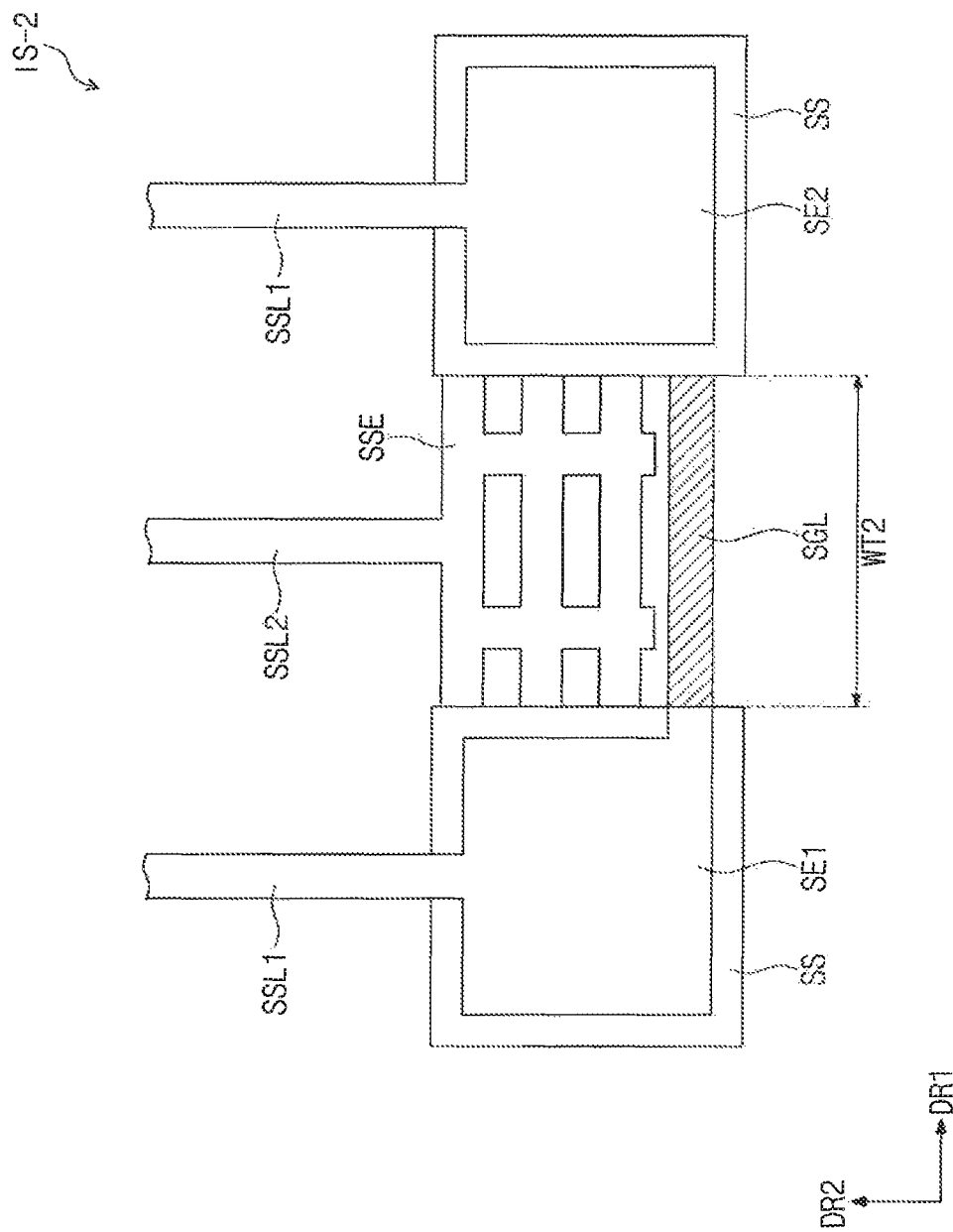
Figure 12C:
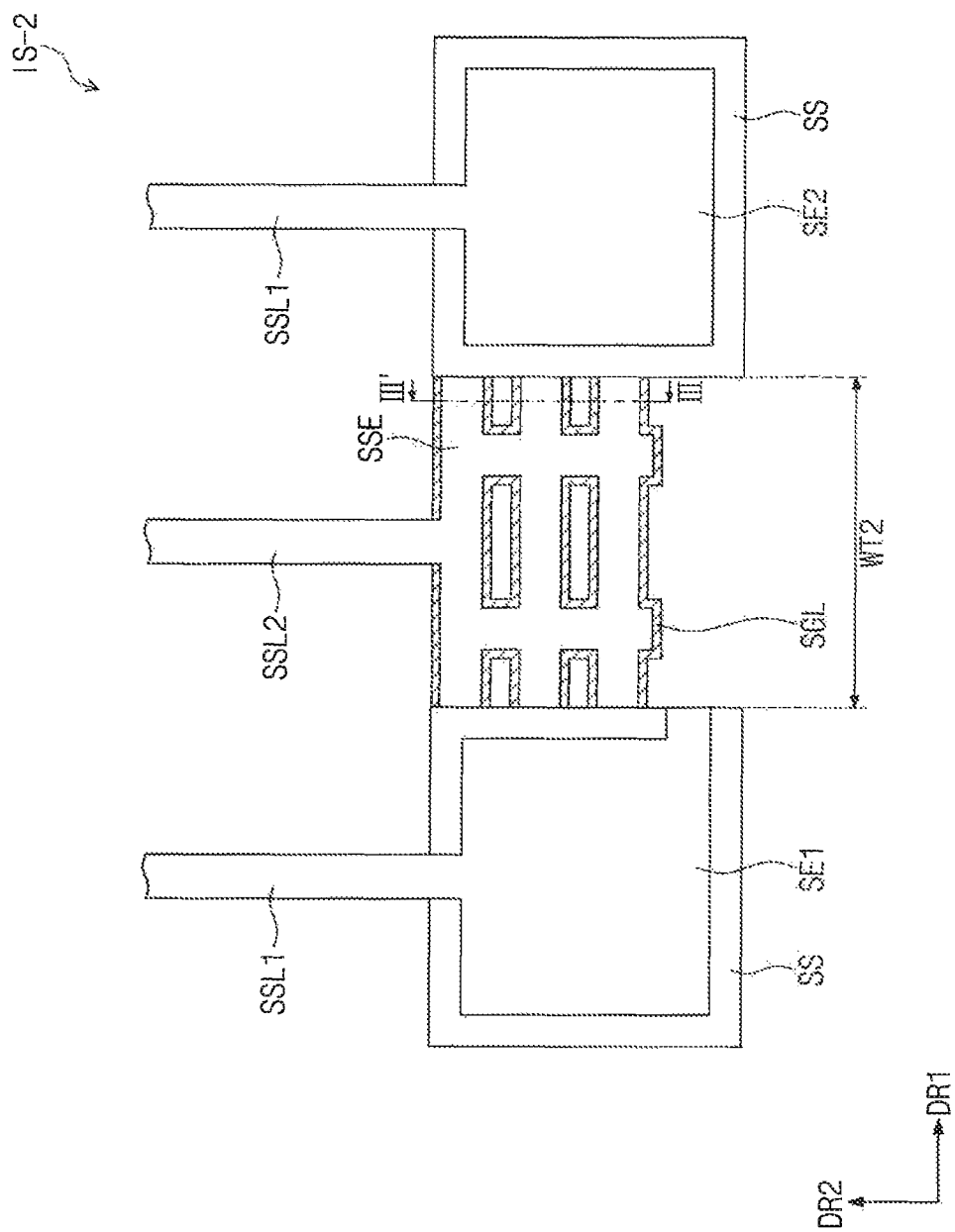

FIGS. 12A to 12C illustrate plan views showing an input sensor according to embodiments of the present inventive concepts. FIG. 12A shows a first mode in which an input sensor is not stretched. FIGS. 12B and 12C show a second mode in which an input sensor is stretched. FIGS. 12A to 12C each roughly depict a portion of the input sensor in the first or second mode.

Referring to the embodiments of FIGS. 12A and 12B, a width WT1 (e.g., length in the first direction DR1) of the subsidiary electrodes SSE included in the input sensor IS-1 in the first mode may be greater than a width WT2 (e.g., length in the first direction DR1) of the subsidiary electrodes SSE included in the input sensor IS-1 in the second mode. For example, a spacing interval between the first and second sensing electrodes SE1 and SE2 may be greater in the second mode than in the first mode.

As shown in the embodiments of FIGS. 12A and 12B, when viewed in a plan view (e.g., in a plane defined in the first and second directions DR1, DR2), the wiring part SGL may be disposed to overlap none of the subsidiary electrodes SSE (e.g., in a thickness direction thereof). Differently from the embodiments of FIGS. 11A to 11C, the wiring part SGL and the subsidiary electrodes SSE may not overlap each other in a thickness direction thereof.

Figure 13:
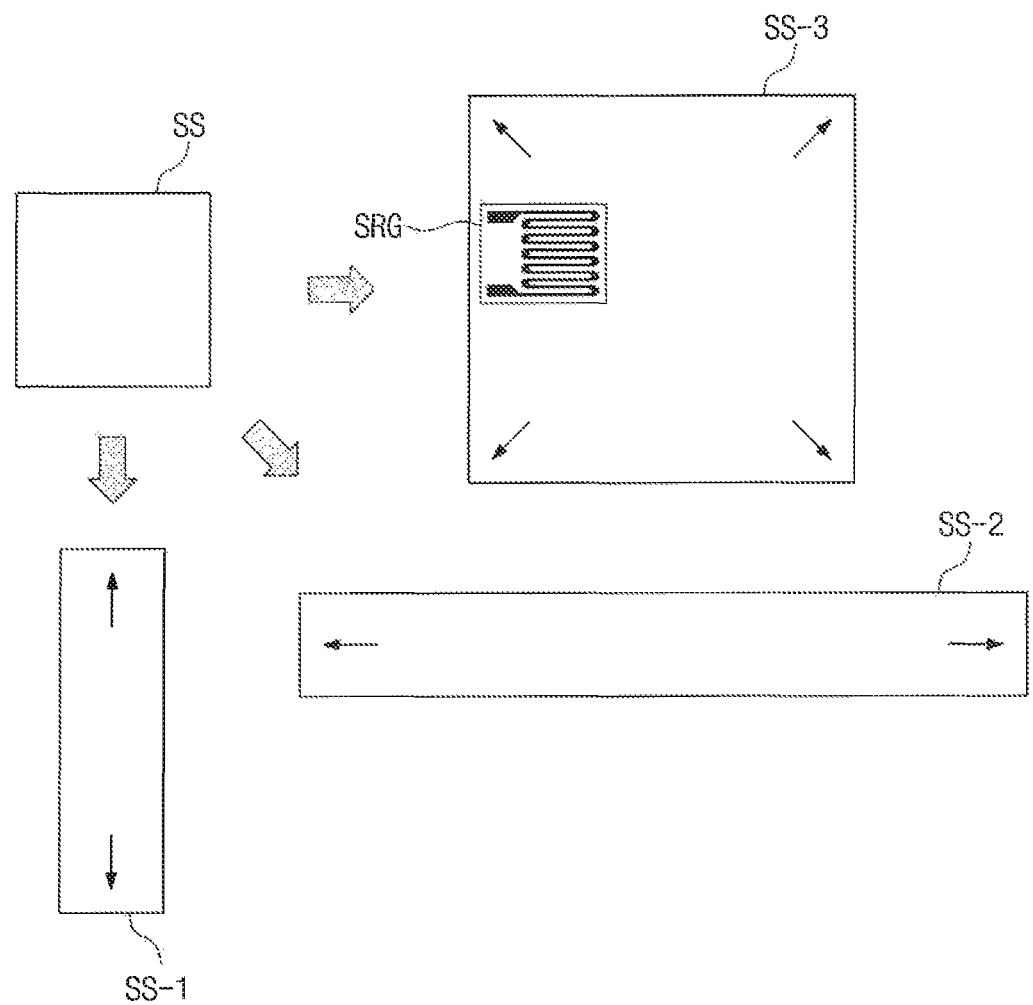
FIG. 13 illustrates a plan view showing a strain gauge according to an embodiment of the present inventive concepts.
Figure 13:
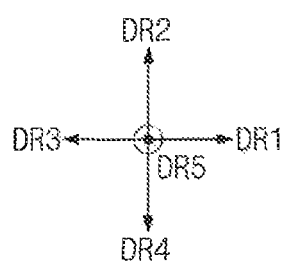
Figure 14:
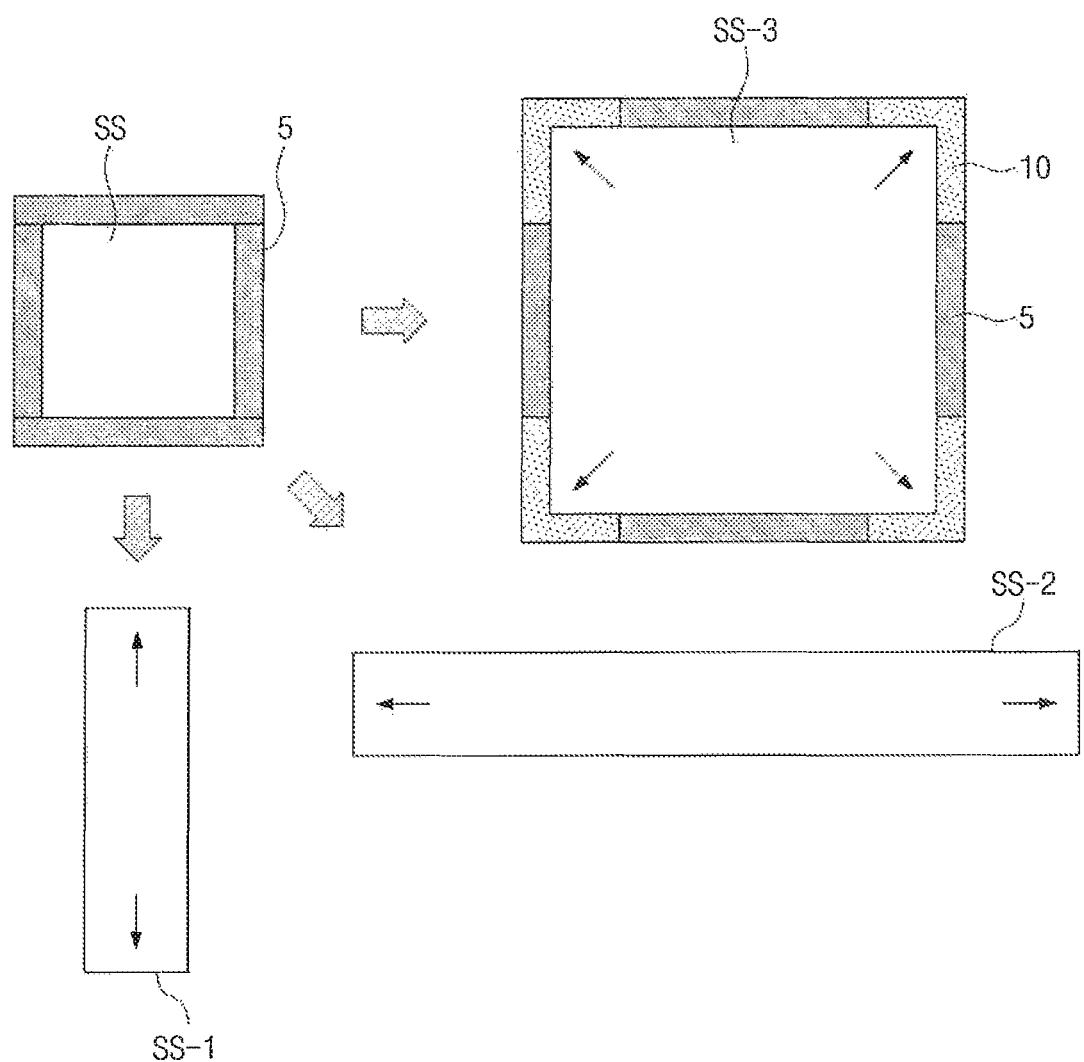
FIG. 14 illustrates a plan view showing a stretchable substrate according to an embodiment of the present inventive concepts.
Figure 15:
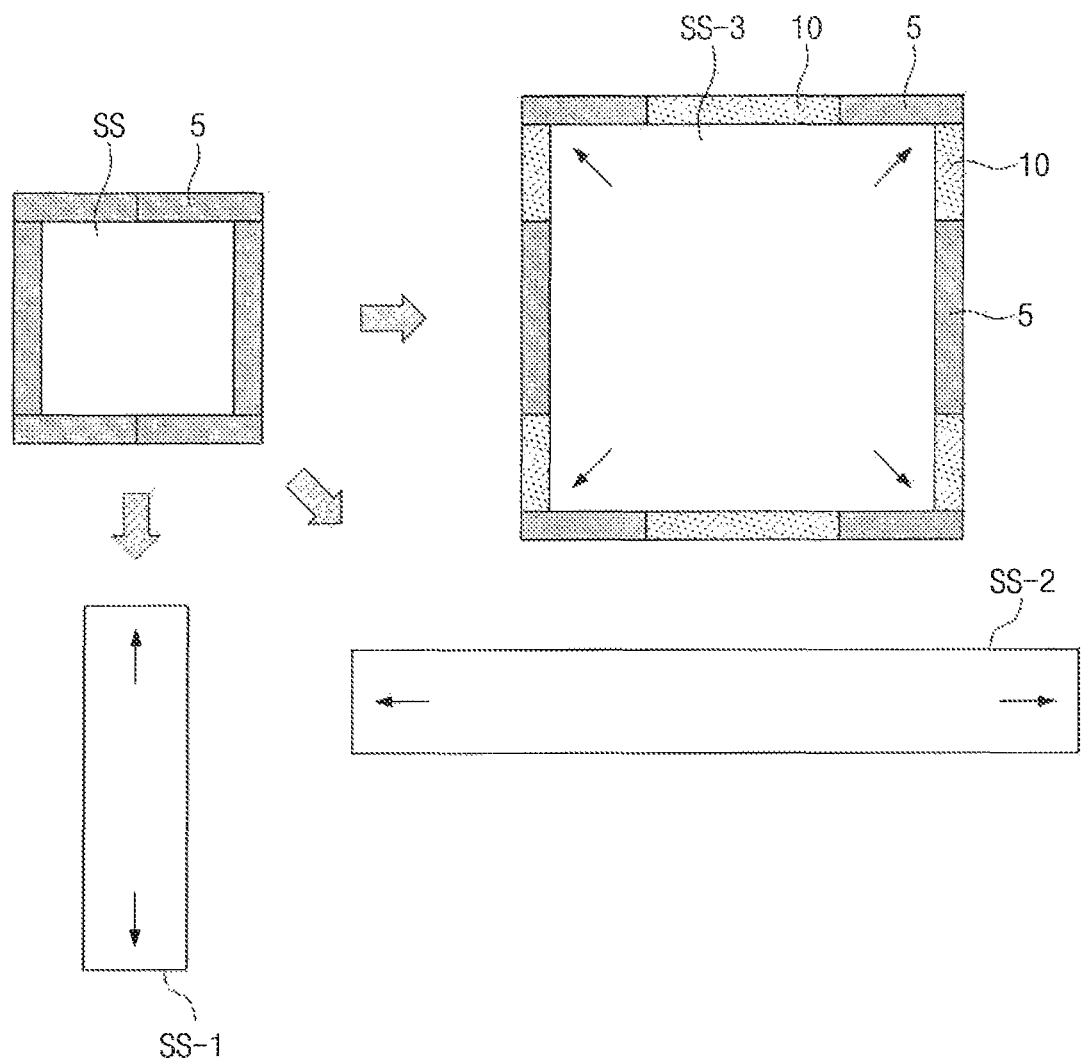
FIG. 15 illustrates a plan view showing a stretchable substrate according to an embodiment of the present inventive concepts.

As shown in the embodiment of FIG. 12C, the wiring part SGL and the subsidiary electrodes SSE may overlap each other in a thickness direction thereof. In this embodiment, the wiring part SGL has a mesh shape. The subsidiary electrodes SSE and the wiring part SGL may have a mesh shape and may thus be easily stretched. FIG. 11B shows a cross-section taken along line III-III' of FIG. 12C. FIG. 13 illustrates a plan view showing a strain gauge according to an embodiment of the present inventive concepts. FIG. 14 illustrates a plan view showing a stretchable substrate according to an embodiment of the present inventive concepts. FIG. 15 illustrates a plan view showing a stretchable substrate according to an embodiment of the present inventive concepts.

In an embodiment, the stretchable substrate SS may include a strain gauge SRG that determines either the first mode or the second mode. The strain gauge SRG may have various ordinary shapes. The strain gauge SRG may detect various stretched shapes, such as the first to third stretched shapes SS-1, SS-2, and SS-3 of the stretchable substrate SS shown in FIGS. 13-15.

As shown in the embodiment of FIGS. 14-15, the stretchable substrate SS may include a stretching tool 5 whose shape is variously changed. As shown in FIG. 14, when the stretchable substrate SS is stretched, the stretching tool 5 may be disposed on locations (e.g., edges) of the stretchable substrate SS that are oriented in the first and third directions DR1 and DR3 and in the second and fourth directions DR2 and DR4. As shown in FIG. 15, the stretching tool 5 may also be disposed on locations (e.g., edges) of the stretchable substrate SS that are oriented in a diagonal direction between the first and third directions DR1 and DR3 and in a diagonal direction between the second and fourth directions DR2 and DR4.

In an embodiment, the stretching tool 5 may be disposed on various positions to allow the stretchable substrate SS to stretch its elongation parts 10 and the positions of the stretching tool 5 are not limited to those shown in the embodiments of FIGS. 14-15.

Figure 16:
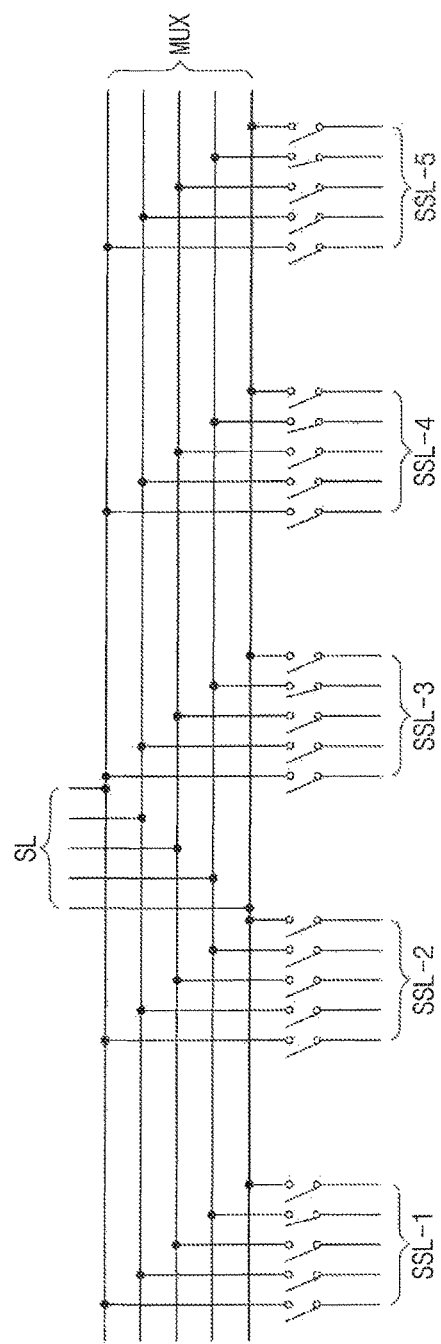
FIG. 16 illustrates a schematic diagram showing a multiplexer according to an embodiment of the present inventive concepts.

FIG. 16 illustrates a schematic diagram showing a multiplexer according to an embodiment of the present inventive concepts.

FIG. 16 will be discussed with reference to FIG. 10B. A multiplexer MUX may correspond to any one of the first to fifth multiplexers MX-1 to MX-S. The multiplexer MUX may connect a plurality of sensing lines, such as first to fifth sensing lines SSL-1 to SSL-5 into a single wiring line SL, and may connect the single wiring line SL to the input detection circuit TIC. Although the embodiment of FIG. 16 shows a multiplexer MUX according to an embodiment of the present inventive concepts, embodiments of the present inventive concepts are not limited thereto and the multiplexer MUX may include variously shaped multiplexers.

Figure 17:
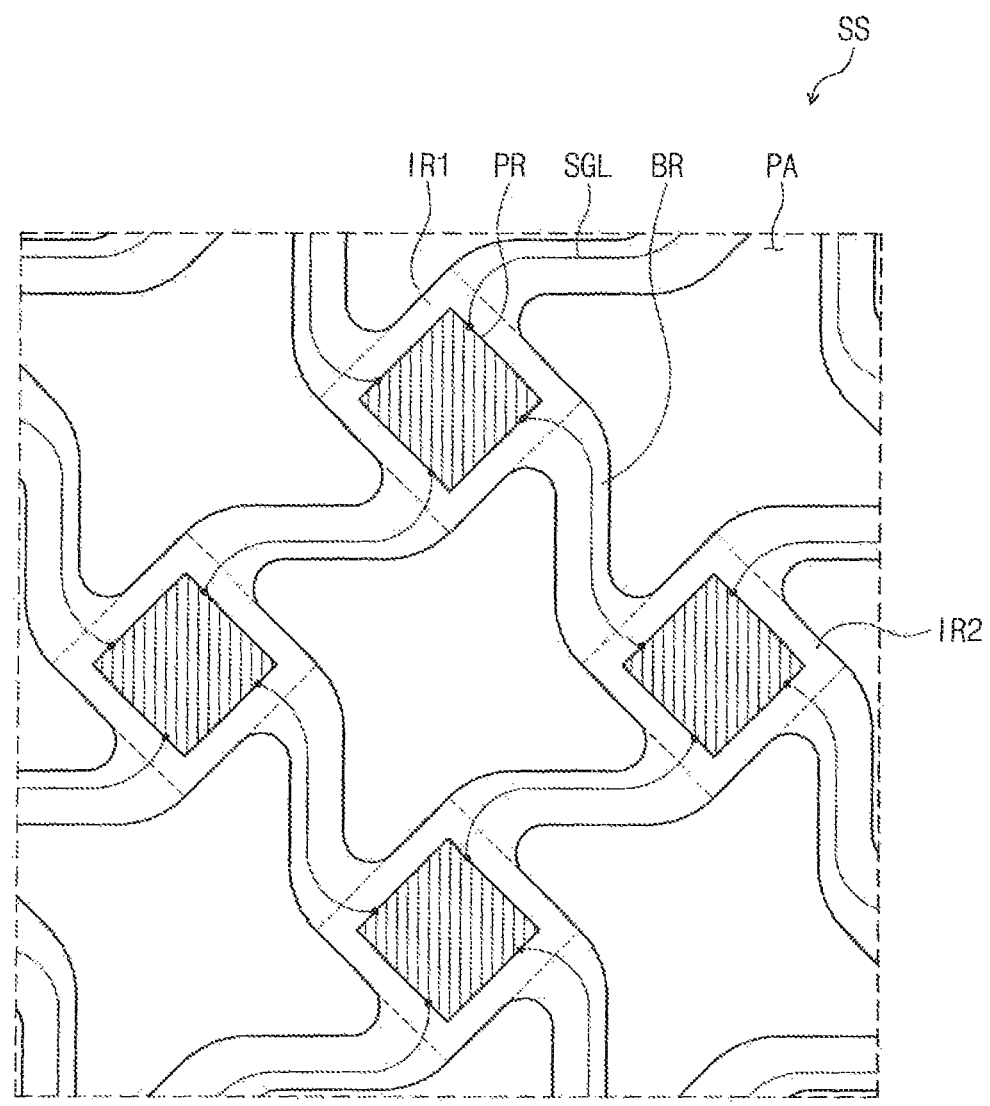
FIG. 17 illustrates a plan view showing a stretchable substrate according to an embodiment of the present inventive concepts.

FIG. 17 illustrates a plan view showing a stretchable substrate according to an embodiment of the present inventive concepts.

Referring to the embodiment of FIG. 17, the display panel DP may include display parts PR that overlap the first and second island regions IR1 and IR2, and may also include wiring parts SGL that overlap the bridge regions BR (e.g., in a thickness direction thereof).

The stretchable substrate SS according to an embodiment may include the first and second island regions IR1 and IR2, the bridge region BR that connects the first and second island regions IR1 and IR2, and a perforation region PA disposed adjacent thereto. In an embodiment, the stretchable substrate SS includes a polymer, such as at least one compound selected from polyimide, polyethylene, and polypropylene. However, embodiments of the present inventive concepts are not limited thereto.

In an embodiment, the first and second island regions IR1 and IR2 may have a tetragonal shape when viewed in a plan view. However, embodiments of the present inventive concepts are not limited thereto, and may include a triangular shape, a pentagonal shape, a hexagonal shape, a polygonal shape, a circular shape, an oval shape, a closed loop shape, an irregular shape or any other planar shape. The bridge region BR connects to each other adjacent island regions among a plurality of island regions, such as the first and second island regions IR1 and IR2. In an embodiment, the bridge region BR may be formed integrally with the first and second island regions IR1 and IR2, and may extend from a first island region IR1 to a second island region IR2. The bridge region BR may have a curved band shape when viewed in a plan view. However, embodiments of the present inventive concepts are not limited thereto and the bridge region BR may vary.

The perforation region PA is surrounded by the first and second island regions IR1 and IR2 and the bridge region BR. In an embodiment, the perforation region PA may be a perforated portion of the stretchable substrate SS. However, embodiments of the present inventive concepts are not limited thereto. For example, in an embodiment, the perforation region PA may be a recessed portion of the stretchable substrate SS. The display parts PR display an image. In an embodiment, the display parts PR may each be a pixel that is a minimum unit to display an image. However, embodiments of the present inventive concepts are not limited thereto. A plurality of display parts PR are correspondingly positioned on a plurality of island regions IR1 and IR2. The wiring part SGL connects a plurality of display parts PR to each other. For example, the wiring part SGL is positioned on the bridge region BR and extends from the first island region IR1 via the wiring part SGL to the second island region IR2. The wiring part SGL may extend curvedly along the bridge region BR. However, embodiments of the present inventive concepts are not limited thereto. For example, in an embodiment, the wiring part SGL may extend in a straight direction.

A display device according to an embodiment of the present inventive concepts is configured such that an input sensor is free of fail even when the input sensor is stretched by an external force.

According to an embodiment of the present inventive concepts, the input sensor may be configured to include subsidiary electrodes between sensing electrodes thereof and to detect inputs during the elongation thereof. As a result, it may be possible to supplement an increased interval between the sensing electrodes and to prevent defects of the input sensor.

Some embodiments have been described in the specification and drawings. Although specific embodiments and terms are used herein, they are merely used for the purpose of describing the present inventive concepts rather than limiting technical meanings or the scope of the present inventive concepts. Therefore, it will be appreciated by a person of ordinary skill in the art that various modifications and equivalent embodiments may be made from the present inventive concepts.

What is claimed is:

1. A display device, comprising:
a stretchable substrate that includes a plurality of unit regions, wherein each of the plurality of unit regions includes a plurality of island regions and at least one bridge region that connects adjacent island regions of the plurality of island regions to each other;
a display panel on the stretchable substrate, wherein the display panel includes a plurality of display parts and at least one wiring part, the plurality of display parts correspondingly overlapping the plurality of island regions, and the at least one wiring part correspondingly overlaps the at least one bridge region;
an input sensor on the display panel, wherein the input sensor includes a plurality of sensing electrodes and at least one subsidiary electrode, the plurality of sensing electrodes correspondingly overlapping the plurality of display parts, and the at least one subsidiary electrode is correspondingly overlapping the at least one wiring part; and
an input detection circuit that calculates a plurality of coordinate data that correspond to the plurality of sensing electrodes.

2. The display device of claim 1, wherein the plurality of sensing electrodes include a first sensing electrode and a second sensing electrode that are adjacent to each other,
wherein the at least one subsidiary electrode is disposed between the first sensing electrode and the second sensing electrode.

3. The display device of claim 2, wherein:
the stretchable substrate has a first mode in an unstretched state and a second mode in a stretched state,
wherein the plurality of unit regions are spaced apart from each other at a first distance in the first mode and are spaced apart from each other at a second distance in the second mode, the second distance is greater than the first distance.

4. The display device of claim 3, wherein the first sensing electrode and the second sensing electrode are spaced apart from each other at substantially the first distance in the first mode and are spaced apart from each other at substantially the second distance in the second mode.

5. The display device of claim 4, wherein:
the at least one subsidiary electrode has a first area in the first mode and is deactivated for detecting an external input; and
the at least one subsidiary electrode has a second area in the second mode and is activated to detect the external input.

6. The display device of claim 5, wherein:
the first area is proportional to the first distance; and
the second area is proportional to the second distance.

7. The display device of claim 5, wherein:

the first sensing electrode has a first coordinate data;

the second sensing electrode has a second coordinate data; and the input detection circuit calculates the first coordinate data and the second coordinate data that respectively correspond to the first sensing electrode and the second sensing electrode when the external input is detected through the first sensing electrode and the second sensing electrode.

8. The display device of claim 7, wherein a first subsidiary electrode of the at least one subsidiary electrode is disposed between the first and second sensing electrodes, the first subsidiary electrode has a third coordinate data.

9. The display device of claim 8, wherein:

the input detection circuit calculates the first coordinate data and the second coordinate data in the first mode; and the input detection circuit calculates the first coordinate data, the second coordinate data and the third coordinate data in the second mode.

10. The display device of claim 8, wherein the first subsidiary electrode is activated to have a third coordinate data in the second mode; and the input detection circuit remaps at least one of the first coordinate data and the second coordinate data, and calculates the third coordinate data, and the at least one remapped first coordinate data and second coordinate data in the second mode.

11. The display device of claim 10, wherein the stretchable substrate further includes a strain gauge that determines if the stretchable substrate is in the first mode or the second mode.

12. The display device of claim 11, wherein the input detection circuit activates the first subsidiary electrode based on information about the first mode or the second mode received from the strain gauge.

13. An electronic device comprising:

a display device comprising:

a stretchable substrate that includes a plurality of unit regions, wherein each of the plurality of unit regions includes a plurality of island regions and at least one bridge region that connects adjacent island regions of the plurality of island regions to each other;

a display panel on the stretchable substrate, wherein the display panel includes a plurality of display parts and at least one wiring part, the plurality of display parts correspondingly overlapping the plurality of island regions, and the at least one wiring part correspondingly overlaps the at least one bridge region;

an input sensor on the display panel, wherein the input sensor includes a plurality of sensing electrodes and at least one subsidiary electrode, the plurality of sensing electrodes correspondingly overlapping the plurality of display parts, and the at least one subsidiary electrode is correspondingly overlapping the at least one wiring part; and an input detection circuit that calculates a plurality of coordinate data that correspond to the plurality of sensing electrodes.

* * * * *